(12) United States Patent
Yamazaki

(10) Patent No.: US 11,482,625 B2
(45) Date of Patent: Oct. 25, 2022

(54) SPUTTERING TARGET, OXIDE SEMICONDUCTOR, OXYNITRIDE SEMICONDUCTOR, AND TRANSISTOR

(71) Applicant: Semiconductor Energy Laboratory Co., Ltd., Atsugi (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 613 days.

(21) Appl. No.: 16/572,910

(22) Filed: Sep. 17, 2019

(65) Prior Publication Data
US 2020/0013894 A1 Jan. 9, 2020

Related U.S. Application Data

(62) Division of application No. 15/602,299, filed on May 23, 2017, now Pat. No. 10,461,197.

(30) Foreign Application Priority Data

Jun. 3, 2016 (JP) ................................ 2016-112153
Jun. 6, 2016 (JP) ................................ 2016-113026

(51) Int. Cl.
  *H01L 21/02* (2006.01)
  *H01L 29/786* (2006.01)
  (Continued)

(52) U.S. Cl.
  CPC ...... *H01L 29/7869* (2013.01); *C23C 14/0676* (2013.01); *C23C 14/08* (2013.01);
  (Continued)

(58) Field of Classification Search
  CPC ... C23C 14/086; C23C 14/0676; C23C 14/08; C23C 14/3414; H01L 21/02554;
  (Continued)

(56) References Cited

U.S. PATENT DOCUMENTS 8,329,506 B2  12/2012  Akimoto et al.
8,643,011 B2  2/2014  Akimoto et al.
(Continued)

FOREIGN PATENT DOCUMENTS

JP  2007-096055 A  4/2007
JP  2012-502486  1/2012
(Continued)

OTHER PUBLICATIONS

Wager.J, "Oxide TFTs: A Progress Report", Information Display, 2016, vol. 32, No. 1, pp. 16-21.
(Continued)

*Primary Examiner* — Nikolay K Yushin
(74) *Attorney, Agent, or Firm* — Robinson Intellectual Property Law Office; Eric J. Robinson

(57) ABSTRACT

A novel oxide semiconductor, a novel oxynitride semiconductor, a transistor including them, or a novel sputtering target is provided. A composite target includes a first region and a second region. The first region includes an insulating material and the second region includes a conductive material. The first region and the second region each include a microcrystal whose diameter is greater than or equal to 0.5 nm and less than or equal to 3 nm or a value in the neighborhood thereof. A semiconductor film is formed using the composite target.

11 Claims, 19 Drawing Sheets

(51) Int. Cl.

| | | |
|---|---|---|
| *C23C 14/08* | (2006.01) | |
| *C23C 14/06* | (2006.01) | |
| *C23C 14/34* | (2006.01) | |
| *H01L 29/24* | (2006.01) | |
| *H01L 29/49* | (2006.01) | |
| *H01L 29/51* | (2006.01) | |
| *H01L 29/66* | (2006.01) | |

(52) U.S. Cl.
CPC ........ *C23C 14/086* (2013.01); *C23C 14/3414* (2013.01); *H01L 21/02554* (2013.01); *H01L 21/02565* (2013.01); *H01L 21/02631* (2013.01); *H01L 29/24* (2013.01); *H01L 29/4908* (2013.01); *H01L 29/518* (2013.01); *H01L 29/66969* (2013.01)

(58) Field of Classification Search
CPC ......... H01L 21/02565; H01L 21/02631; H01L 29/7869; H01L 29/518; H01L 29/4908; H01L 29/66969; H01L 29/24
See application file for complete search history.

(56) References Cited

U.S. PATENT DOCUMENTS

| | | | |
|---|---|---|---|
| 8,907,336 | B2 | 12/2014 | Shieh et al. |
| 9,099,563 | B2 | 8/2015 | Shieh et al. |
| 9,252,288 | B2 | 2/2016 | Akimoto et al. |
| 9,267,199 | B2 | 2/2016 | Yamazaki et al. |
| 9,306,078 | B2 | 4/2016 | Shieh et al. |
| 9,406,760 | B2 | 8/2016 | Shimomura et al. |
| 9,559,174 | B2 | 1/2017 | Shimomura et al. |
| 9,583,632 | B2 | 2/2017 | Yamazaki |
| 9,806,201 | B2 | 10/2017 | Yamazaki et al. |
| 9,893,200 | B2 | 2/2018 | Akimoto et al. |
| 9,991,393 | B2 | 6/2018 | Tanaka et al. |
| 10,032,928 | B2 | 7/2018 | Shimomura et al. |
| 10,403,763 | B2 | 9/2019 | Akimoto et al. |
| 10,522,347 | B2 | 12/2019 | Yamazaki et al. |
| 2013/0092924 | A1 | 4/2013 | Sasagawa et al. |
| 2013/0143395 | A1 | 6/2013 | Shieh et al. |
| 2013/0320334 | A1 | 12/2013 | Yamazaki et al. |
| 2014/0042018 | A1 | 2/2014 | Yamazaki |
| 2014/0084287 | A1 | 3/2014 | Yamazaki |
| 2014/0102877 | A1 | 4/2014 | Yamazaki |
| 2014/0346495 | A1 | 11/2014 | Shieh et al. |
| 2015/0021593 | A1 | 1/2015 | Yamazaki |
| 2015/0243738 | A1 | 8/2015 | Shimomura et al. |
| 2015/0318171 | A1 | 11/2015 | Yamazaki |
| 2015/0357480 | A1 | 12/2015 | Yu et al. |
| 2016/0064406 | A1 | 3/2016 | Natori et al. |
| 2016/0126355 | A1 | 5/2016 | Shih et al. |
| 2016/0160342 | A1 | 6/2016 | Yamazaki et al. |
| 2016/0197139 | A1 | 7/2016 | Shieh et al. |
| 2016/0349557 | A1 | 12/2016 | Shishido et al. |
| 2016/0349558 | A1 | 12/2016 | Shishido et al. |
| 2016/0356645 | A1 | 12/2016 | Yoneda et al. |
| 2016/0365367 | A1 | 12/2016 | Kimura et al. |
| 2016/0372606 | A1 | 12/2016 | Ito et al. |
| 2016/0381266 | A1 | 12/2016 | Ohmaru |
| 2017/0288023 | A1 | 10/2017 | Yamazaki et al. |
| 2020/0144059 | A1 | 5/2020 | Yamazaki et al. |

FOREIGN PATENT DOCUMENTS

| | | |
|---|---|---|
| JP | 2014-039047 A | 2/2014 |
| JP | 2014-047361 A | 3/2014 |
| JP | 2014-129590 A | 7/2014 |
| JP | 2014-194076 A | 10/2014 |
| JP | 2015-038980 A | 2/2015 |
| JP | 2015-062250 A | 4/2015 |
| JP | 2015-073114 A | 4/2015 |
| JP | 2015-181161 A | 10/2015 |
| JP | 2016-056446 A | 4/2016 |
| JP | 2016-074580 A | 5/2016 |
| JP | 2016-082238 A | 5/2016 |
| KR | 2010-0056970 A | 5/2010 |
| WO | WO-2010/028269 | 3/2010 |
| WO | WO-2015/132697 | 9/2015 |

OTHER PUBLICATIONS

Xiao.T et al., "Metal Oxide TFT Turnkey Manufacturing Solutions for a-SI TFT Lines", SID Digest '16 : SID International Symposium Digest of Technical Papers, 2016, pp. 318-321.

International Search Report (Application No. PCT/IB2017/053016) dated Aug. 29, 2017.

Written Opinion (Application No. PCT/IB2017/053016) dated Aug. 29, 2017.

US 11,482,625 B2

SPUTTERING TARGET, OXIDE SEMICONDUCTOR, OXYNITRIDE SEMICONDUCTOR, AND TRANSISTOR

TECHNICAL FIELD

The present invention relates to an object, a method, or a manufacturing method. The present invention relates to a process, a machine, manufacture, or a composition of matter. One embodiment of the present invention particularly relates to an oxide semiconductor, an oxynitride semiconductor, a manufacturing method of the oxide semiconductor, or a manufacturing method of the oxynitride semiconductor. One embodiment of the present invention relates to a semiconductor device, a display device, a liquid crystal display device, a light-emitting device, a power storage device, a memory device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

A technique for forming a transistor using an In-Ga-Zn-based oxide semiconductor is disclosed (see, for example, Patent Document 1).

Non-Patent Document 1 discusses a structure including an oxide semiconductor with two stacked layers of indium zinc oxide and IGZO as an active layer of a transistor.

[References]
[Patent Document]
  [Patent Document 1] Japanese Published Patent Application No. 2007-096055
[Non-Patent Document]
  [Non-Patent Document 1] John F. Wager, "Oxide TFTs: A Progress Report", Information Display 1/16, SID 2016, January/February 2016, Vol. 32, No. 1, pp. 16-21

DISCLOSURE OF INVENTION

In Non-Patent Document 1, a channel-protective bottom-gate transistor achieves high field-effect mobility ($\mu$=62 cm$^2$V$^{-1}$s$^{-1}$). An active layer of the transistor is a two-layer stack of indium zinc oxide and IGZO, and the thickness of the indium zinc oxide where a channel is formed is 10 nm. However, the S value (the subthreshold swing (SS)), which is one of transistor characteristics, is as large as 0.41 V/decade. Moreover, the threshold voltage ($V_{th}$), which is also one of transistor characteristics, is -2.9 V, which means that the transistor has a normally-on characteristic.

In view of the above problems, an object of one embodiment of the present invention is to provide a novel oxide semiconductor or a novel oxynitride semiconductor. Another object of one embodiment of the present invention is to provide a novel sputtering target. Another object of one embodiment of the present invention is to give favorable electrical characteristics to a semiconductor device. Another object of one embodiment of the present invention is to provide a highly reliable semiconductor device. Another object of one embodiment of the present invention is to provide a semiconductor device with a novel structure. Another object of one embodiment of the present invention is to provide a display device with a novel structure.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a sputtering target including a first region and a second region. The first region includes an insulating material and the second region includes a conductive material. The first region and the second region each include a microcrystal whose diameter is greater than or equal to 0.5 nm and less than or equal to 3 nm or a value in the neighborhood thereof.

In the above structure, one or more of AlO$_x$ (x is a given number greater than 0), AlN$_y$ (y is a given number greater than 0), AlO$_x$N$_y$, SiO$_x$, SiN$_y$, and SiO$_x$N$_y$ are used as the insulating material, and one or more of InO$_x$, InN$_y$, InO$_x$N$_y$, ZnO$_x$, ZnN$_y$, and ZnO$_x$N$_y$ are used as the conductive material.

In the above structure, AlO$_x$ (0<x<1.65) is preferably used as the insulating material. Alternatively, in the above structure, AlO$_x$N$_y$ (0<x<1.65 and 0<y<1.65) is preferably used as the insulating material. Alternatively, in the above structure, SiO$_x$ (0<x<2.2) is preferably used as the insulating material. Alternatively, in the above structure, SiO$_x$N$_y$ (0<x<2.2 and 0<y<2.2) is preferably used as the insulating material.

In the above structure, the first region and the second region each preferably include a microcrystal whose diameter is greater than or equal to 1 nm and less than or equal to 2 nm or a value in the neighborhood thereof.

In the above structure, the atomic ratio of In to Al and Zn (In:Al:Zn) is preferably 4:2:3 or a neighborhood of 4:2:3. Alternatively, in the above structure, the atomic ratio of In to Al and Zn (In:Al:Zn) is preferably 5:1:6 or a neighborhood of 5:1:6. In the above structure, the atomic ratio of In to Si and Zn (In:Si:Zn) is preferably 4:2:3 or a neighborhood of 4:2:3. Alternatively, in the above structure, the atomic ratio of In to Si and Zn (In:Si:Zn) is preferably 5:1:6 or a neighborhood of 5:1:6.

Another embodiment of the present invention is an oxide semiconductor or an oxynitride semiconductor that are deposited using the above-mentioned sputtering target. Another embodiment of the present invention is a transistor including the above-mentioned oxide semiconductor or oxynitride semiconductor.

Another embodiment of the present invention is an oxynitride semiconductor including a first region and a second region. The first region includes an element M (the element M is one or more of Al, Si, Y, B, Ti, Fe, Ni, Ge, Zr, Mo, La, Ce, Nd, Hf, Ta, W, Mg, V, Be, and Cu). The second region includes indium. The first region and the second region are arranged in a mosaic pattern.

In the above structure, the oxynitride semiconductor preferably includes a third region. The element M is preferably aluminum. The first region preferably includes aluminum oxynitride or aluminum zinc oxynitride. The second region preferably includes indium oxynitride or indium zinc oxynitride. The third region preferably includes zinc oxynitride.

In the above structure, the oxynitride semiconductor preferably includes a third region. The element M is preferably silicon. The first region preferably includes silicon oxynitride or silicon zinc oxynitride. The second region preferably includes indium oxynitride or indium zinc oxynitride. The third region preferably includes zinc oxynitride.

In the above structure, it is preferable that a surrounding portion of the first region, the second region, or the third region be blurred and that the first region, the second region, or the third region have a cloud-like composition.

In the above structure, a diameter of the first region is preferably greater than or equal to 1 nm and less than or equal to 2 nm or a value in the neighborhood thereof.

In the above structure, the atomic ratio of indium to the element M and zinc (In:M:Zn) is preferably 4:2:3 or a neighborhood of 4:2:3. Alternatively, in the above structure, the atomic ratio of indium to the element M and zinc (In:M:Zn) is preferably 5:1:6 or a neighborhood of 5:1:6. Alternatively, in the above structure, the atomic ratio of indium to the element M and zinc (In:M:Zn) is preferably 1:1:1 or a neighborhood of 1:1:1.

Another embodiment of the present invention is a transistor including the above-mentioned oxynitride semiconductor.

In the above structure, the transistor preferably includes a gate insulating film in contact with the oxynitride semiconductor. The gate insulating film preferably includes silicon nitride.

According to one embodiment of the present invention, a novel oxide semiconductor or a novel oxynitride semiconductor can be provided. According to one embodiment of the present invention, a novel sputtering target can be provided. According to one embodiment of the present invention, a semiconductor device can be provided with favorable electrical characteristics. According to one embodiment of the present invention, a highly reliable semiconductor device can be provided. According to one embodiment of the present invention, a semiconductor device with a novel structure can be provided. According to one embodiment of the present invention, a display device with a novel structure can be provided.

Note that the descriptions of these effects do not disturb the existence of other effects. One embodiment of the present invention does not necessarily achieve all the effects. Other effects will be apparent from and can be derived from the description of the specification, the drawings, the claims, and the like.

BEST MODE FOR CARRYING OUT THE INVENTION

Figure 1A:
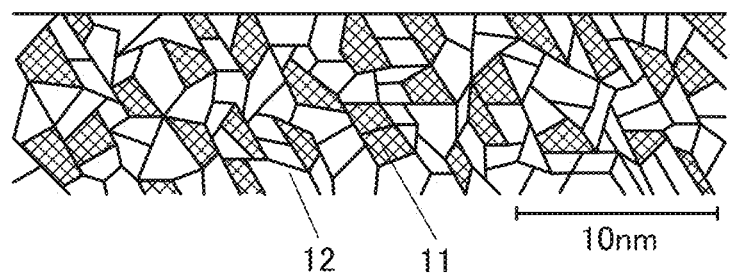
FIG. 1A is a schematic view of a sputtering target.

Hereinafter, embodiments will be described with reference to drawings. Note that the embodiments can be implemented with various modes. It will be readily appreciated by those skilled in the art that modes and details can be changed in various ways without departing from the spirit and scope of the present invention. Thus, the present invention should not be interpreted as being limited to the description in the following embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

In this specification, terms for describing arrangement, such as "over", "above", "under", and "below", are used for convenience in describing a positional relation between components with reference to drawings. The positional relationship between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor includes a channel region between a drain (a drain terminal, a drain region, or a drain electrode) and a source (a source terminal, a source region, or a source electrode), and current can flow between the drain and the source through the channel region. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the term "electrically connected" includes the case where components are connected through an "object having any electric function". There is no particular limitation on the "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

In this specification and the like, a "silicon oxynitride film" refers to a film that contains oxygen at a higher proportion than nitrogen, and a "silicon nitride oxide film" refers to a film that contains nitrogen at a higher proportion than oxygen.

In the description of modes of the present invention in this specification and the like with reference to the drawings, the same components in different drawings are denoted by the same reference numeral in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 85° and less than or equal to 95° is also included. The term "substantially perpendicular" indicates that the angle formed between two straight lines is greater than or equal to 60° and less than or equal to 120°.

In this specification and the like, the terms "film" and "layer" can be interchanged with each other depending on the case. For example, in some cases, the term "conductive layer" can be used instead of the term "conductive film", and the term "insulating film" can be used instead of the term "insulating layer".

Note that a "semiconductor" has characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

In this specification and the like, the term "transistor" refers to a semiconductor element having switching characteristics.

Note that in this specification and the like, "In:Ga:Zn=4:2:3 or a neighborhood of In:Ga:Zn=4:2:3" refers to an atomic ratio where, when In is 4 with respect to the total number of atoms, Ga is greater than or equal to 1 and less than or equal to 3 (1≤Ga≤3) and Zn is greater than or equal to 2 and less than or equal to 4 (2≤Zn≤4). "In:Ga:Zn=5:1:6 or a neighborhood of In:Ga:Zn=5:1:6" refers to an atomic ratio where, when In is 5 with respect to the total number of atoms, Ga is greater than 0.1 and less than or equal to 2 (0.1<Ga≤2) and Zn is greater than or equal to 5 and less than or equal to 7 (5≤Zn≤7). "In:Ga:Zn=1:1:1 or a neighborhood of In:Ga:Zn=1:1:1" refers to an atomic ratio where, when In is 1 with respect to the total number of atoms, Ga is greater than 0.1 and less than or equal to 2 (0.1<Ga≤2) and Zn is greater than 0.1 and less than or equal to 2 (0.1<Zn≤2).

In this specification and the like, an oxide semiconductor containing nitrogen refers to an oxynitride semiconductor in some cases. The amount of nitrogen contained in an oxynitride semiconductor is measured by any one of the following methods: Rutherford backscattering spectrometry (RBS), hydrogen forward scattering (HFS), secondary ion mass spectrometry (SIMS), and thermal desorption spectroscopy (TDS). Note that the amount of nitrogen measured by any one of the above methods is higher than the lower measurement limit. An oxide semiconductor and an oxynitride semiconductor are collectively referred to as an oxide semiconductor in some cases.

(Embodiment 1)

In this embodiment, an oxide semiconductor, an oxynitride semiconductor, and a composite target for depositing them, which are one embodiment of the present invention, are described.

An oxide semiconductor or an oxynitride semiconductor (hereinafter collectively referred to as an oxide semiconductor in some cases) preferably contain at least indium. In particular, indium and zinc are preferably contained. In addition, an element M (the element M is one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like) may be contained.

Here, the case where the oxide semiconductor or the oxynitride semiconductor contains indium, the element M, and zinc is considered. Note that the terms of the atomic ratio of indium to the element M and zinc in the oxide semiconductor are denoted by [In], [M], and [Zn], respectively.

<Composite Target>

Figure 1B:
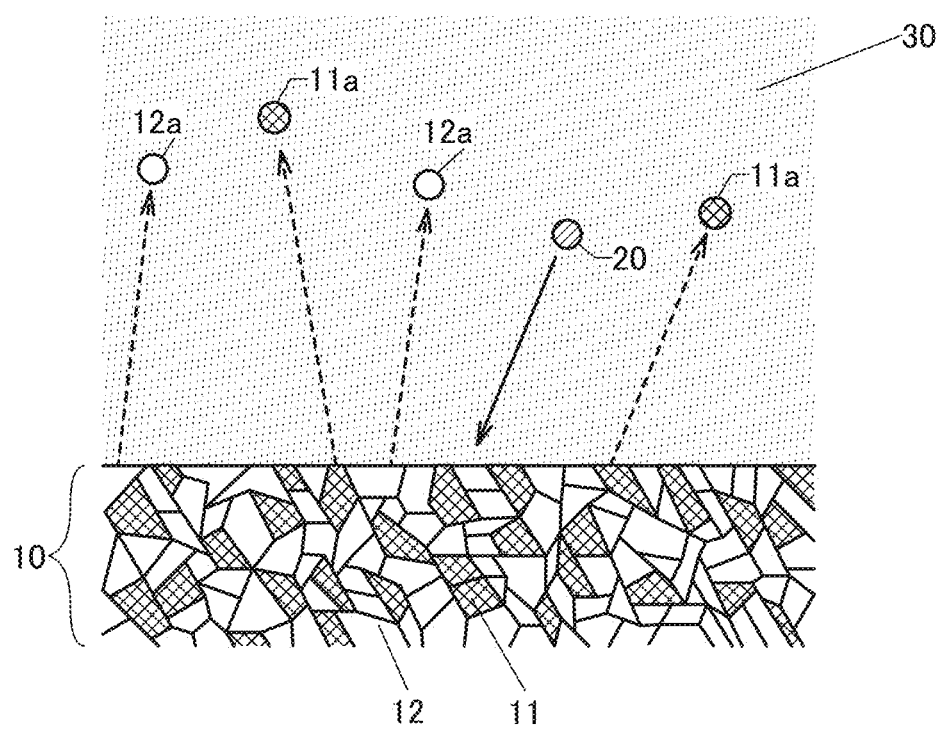
FIG. 1B is a schematic view illustrating deposition using the sputtering target.

FIG. 1A is a cross-sectional view of a sputtering target 10 for depositing the oxide semiconductor or the oxynitride semiconductor by a sputtering method. FIG. 1B illustrates deposition of the oxide semiconductor using the sputtering target 10.

The sputtering target 10 includes a first region 11 including an insulating material and a second region 12 including a conductive material. It is preferable that the first region 11 and the second region 12 each have a crystal structure such as a microcrystalline structure (also referred to as a nano-crystal (nc) structure in some cases) or a polycrystalline structure. FIG. 1A illustrates an example in which the first region 11 and the second region 12 each have a microcrystalline structure. In the case where the first region 11 and/or the second region 12 have a microcrystalline structure, the diameter is preferably greater than or equal to 0.5 nm and less than or equal to 3 nm, greater than or equal to 1 nm and less than or equal to 2 nm, or a value in the neighborhood thereof.

The first region 11 has higher resistance than at least the second region 12. The sputtering target 10 is functionally separated into the first region 11 functioning as an insulating region and the second region 12 functioning as a conductive region. Thus, the sputtering target 10 can be referred to as a composite target.

The first region 11 preferably contains the element M, and the second region 12 preferably contains indium, zinc, or the like. The first region 11 and the second region 12 may each contain oxygen and/or nitrogen. In some cases, the element M (e.g., Ga) has conductivity approximately the same as that of indium oxide or zinc oxide when nitrided; thus, the second region 12 may contain nitride of the element M as appropriate. In the case where such nitride of the element M is used for the first region 11, the first region 11 preferably has higher resistance than the second region 12 by selecting proportions of the element M and nitrogen as appropriate.

An insulating material contained in the first region 11 is preferably one or more of $AlO_x$ (x is a real number greater than 0), $AlN_y$ (y is a real number greater than 0), $AlO_xN_y$, $GaO_x$, $SiO_x$, $SiN_y$, and $SiO_xN_y$, for example. Note that the amount of oxygen in the oxide or the amount of nitrogen in the nitride is, typically, lower than or equal to 110% of the amount of oxygen in the stoichiometric composition or lower than or equal to 110% of the amount of nitrogen in the stoichiometric composition.

The stoichiometric composition of $AlO_x$ is $Al_2O_3$; thus, x is typically set to greater than 0 and less than 1.65. The stoichiometric composition of $AlN_y$ is AlN; thus, y is typically set to greater than 0 and less than 1.1. With regard to $AlO_xN_y$, x and y are typically set to greater than 0 and less than 1.65. The stoichiometric composition of $GaO_x$ is $Ga_2O_3$; thus, x is typically set to greater than 0 and less than 1.65. The stoichiometric composition of $SiO_x$ is $SiO_2$; thus, x is typically set to greater than 0 and less than 2.2. The stoichiometric composition of $SiN_y$ is $Si_3N_4$; thus, y is typically set to greater than 0 and less than 1.47. With regard to $SiO_xN_y$, x and y are typically set to greater than 0 and less than 2.2.

A conductive material contained in the second region 12 is preferably one or more of $InO_x$ (x is a real number greater than 0), $InN_y$ (y is a real number greater than 0), $InO_xN_y$, $GaN_y$, $GaO_xN_y$, $ZnO_x$, $ZnN_y$, and $ZnO_xN_y$, for example. As in the first region 11, the amount of oxygen in the oxide or the amount of nitrogen in the nitride is, typically, lower than or equal to 110% of the amount of oxygen in the stoichiometric composition or lower than or equal to 110% of the amount of nitrogen in the stoichiometric composition.

The stoichiometric composition of $InO_x$ is $In_2O_3$; thus, x is typically set to greater than 0 and less than 1.65. The stoichiometric composition of $InN_y$ is InN; thus, y is typically set to greater than 0 and less than 1.1. With regard to $InO_xN_y$, x and y are typically set to greater than 0 and less than 1.65. The stoichiometric composition of $GaN_y$ is GaN; thus, y is typically set to greater than 0 and less than 1.1. With regard to $GaO_xN_y$, x and y are typically set to greater than 0 and less than 1.65. The stoichiometric composition of $ZnO_x$ is ZnO; thus, x is typically set to greater than 0 and less than 1.1. The stoichiometric composition of $ZnN_y$ is $Zn_3N_2$; thus, y is typically set to greater than 0 and less than 0.73. With regard to $ZnO_xN_y$, x and y are typically set to greater than 0 and less than 1.1.

The sputtering target 10 preferably has an atomic ratio of [In]:[M]:[Zn]=4:2:3, an atomic ratio of [In]:[M]:[Zn]=4:2:4.1, an atomic ratio of [In]:[M]:[Zn]=5:1:6, an atomic ratio of [In]:[M]:[Zn]=5:1:7, or an atomic ratio in the neighborhood thereof. Note that for example, when the sputtering target 10 has an atomic ratio of [In]:[M]:[Zn]=4:2:4.1, a deposited oxide semiconductor film may have an atomic ratio of [In]:[M]:[Zn]=4:2:3 or an atomic ratio in the neighborhood thereof. Furthermore, for example, when the sputtering target 10 has an atomic ratio of [In]:[M]:[Zn]=5:1:7, a deposited oxide semiconductor film may have an atomic ratio of [In]:[M]:[Zn]=5:1:6 or an atomic ratio in the neighborhood thereof. Note that not limited to the above examples, the atomic ratio of the sputtering target 10 is determined as appropriate so as to satisfy atomic ratios in phase diagrams in FIGS. 16A to 16C which are described later or an atomic ratio in the neighborhood thereof.

Figure 2A:
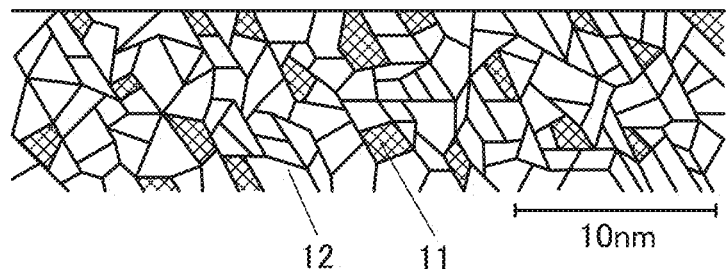
FIGS. 2A and 2B are schematic views of a sputtering target.
Figure 2B:
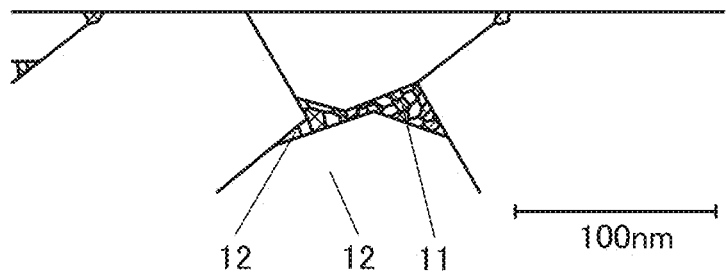

The sputtering target 10 does not always have the structure as illustrated in FIGS. 1A and 1B. For example, as illustrated in FIG. 2A, the number of the first regions 11 is extremely smaller than the number of the second regions 12 in the sputtering target 10 in some cases. Furthermore, as illustrated in FIG. 2B, some parts of the second regions 12 may have polycrystalline structures. In this case, the first regions 11 and the other parts of the second regions 12 may be formed between the second regions 12 having the polycrystalline structures.

<Sputtering Apparatus>

Figure 3A:
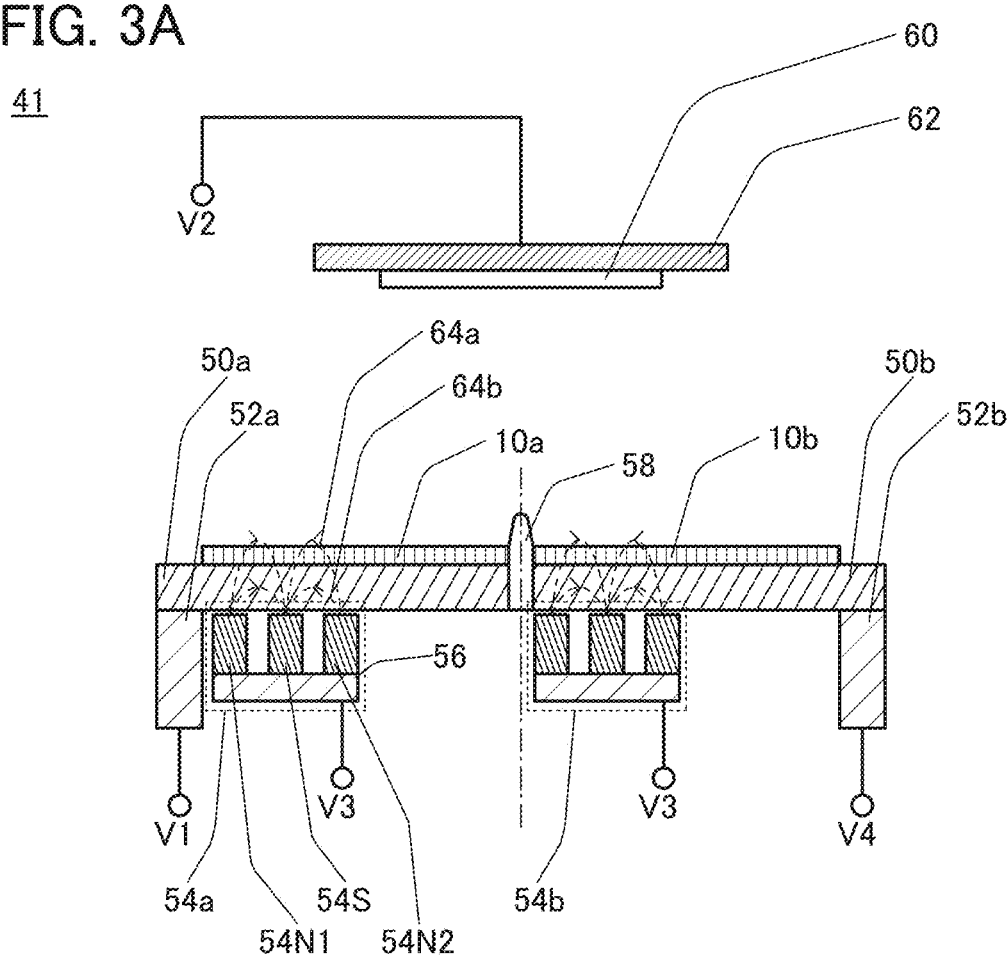
FIGS. 3A and 3B are schematic views of a sputtering apparatus.
Figure 3B:
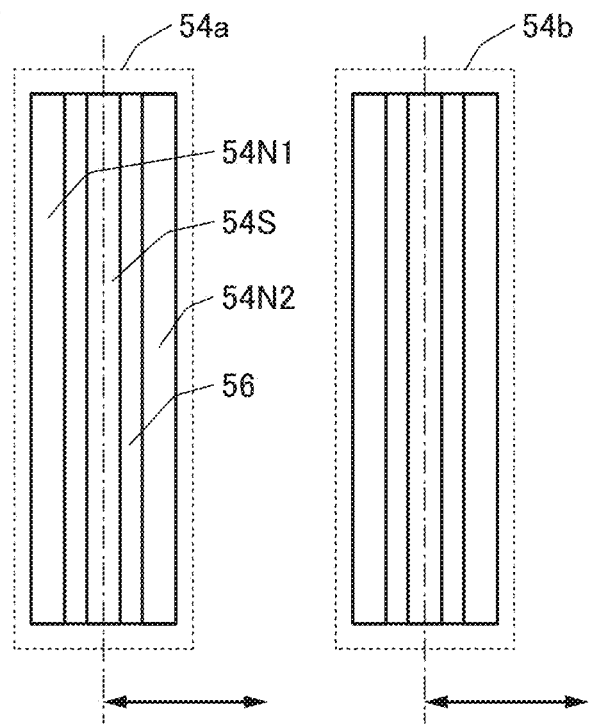

A sputtering apparatus in which the sputtering target 10 can be used is described with reference to FIGS. 3A and 3B. FIG. 3A is a cross-sectional view of a deposition chamber 41 of the sputtering apparatus. FIG. 3B is a plan view of a magnet unit 54a and a magnet unit 54b of the sputtering apparatus.

The deposition chamber 41 illustrated in FIG. 3A includes a target holder 52a, a target holder 52b, a backing plate 50a, a backing plate 50b, a sputtering target 10a, a sputtering target 10b, a member 58, and a substrate holder 62. Note that the sputtering target 10a is placed over the backing plate 50a. The backing plate 50a is placed over the target holder 52a. The magnet unit 54a is placed under the sputtering target 10a with the backing plate 50a positioned therebetween. The sputtering target 10b is placed over the backing plate 50b. The backing plate 50b is placed over the target holder 52b. The magnet unit 54b is placed under the sputtering target 10b with the backing plate 50b positioned therebetween.

As illustrated in FIGS. 3A and 3B, the magnet unit 54a includes a magnet 54N1, a magnet 54N2, a magnet 54S, and a magnet holder 56. The magnet 54N1, the magnet 54N2, and the magnet 54S are placed over the magnet holder 56 in the magnet unit 54a. The magnet 54N1, the magnet 54N2, and the magnet 54S are spaced. Note that the magnet unit 54b has a structure similar to that of the magnet unit 54a. When a substrate 60 is transferred into the deposition chamber 41, the substrate 60 is placed in contact with the substrate holder 62.

The sputtering target 10a, the backing plate 50a, and the target holder 52a are separated from the sputtering target 10b, the backing plate 50b, and the target holder 52b by the member 58. Note that the member 58 is preferably an insulator. The member 58 may be a conductor or a semiconductor. The member 58 may be a conductor or a semiconductor whose surface is covered with an insulator.

The target holder 52a and the backing plate 50a are fixed to each other with a screw (e.g., a bolt) and have the same potential. The target holder 52a has a function of supporting the sputtering target 10a with the backing plate 50a positioned therebetween. The target holder 52b and the backing plate 50b are fixed to each other with a screw (e.g., a bolt) and have the same potential. The target holder 52b has a function of supporting the sputtering target 10b with the backing plate 50b positioned therebetween.

The backing plate 50a has a function of fixing the sputtering target 10a. The backing plate 50b has a function of fixing the sputtering target 10b.

Magnetic lines of force 64a and 64b formed by the magnet unit 54a are illustrated in FIG. 3A.

As illustrated in FIG. 3B, the magnet unit 54a has a structure in which the magnet 54N1 having a rectangular or substantially rectangular shape, the magnet 54N2 having a rectangular or substantially rectangular shape, and the magnet 54S having a rectangular or substantially rectangular shape are fixed to the magnet holder 56. The magnet unit 54a can be oscillated horizontally as shown by an arrow in FIG. 3B. For example, the magnet unit 54a may be oscillated with a beat (also referred to as rhythm, pulse, frequency, period, cycle, or the like) of greater than or equal to 0.1 Hz and less than or equal to 1 kHz.

The magnetic field over the sputtering target 10a changes as the magnet unit 54a is oscillated. The region with an intense magnetic field is a high-density plasma region; thus, sputtering of the sputtering target 10a easily occurs in the vicinity of the region. The same applies to the magnet unit 54b.

<Deposition Flow of Oxide Semiconductor>

Next, a method for depositing an oxide semiconductor or an oxynitride semiconductor using the sputtering target 10 is described. The method is divided into first to fourth steps.

The first step includes a step of placing a substrate in a deposition chamber.

For example, in the first step, the substrate 60 is placed on the substrate holder 62 of the deposition chamber 41 in FIG. 3A.

The temperature of the substrate 60 in deposition influences the electrical properties of an oxide semiconductor. The higher the substrate temperature is, the higher the crystallinity and reliability of the oxide semiconductor can be. In contrast, the lower the substrate temperature is, the lower the crystallinity of the oxide semiconductor can be and the higher the carrier mobility thereof can be. In particular, the lower the substrate temperature in deposition is, the more notably the field-effect mobility at a low gate voltage (e.g., higher than 0 V and lower than or equal to 2 V) is increased in a transistor including the oxide semiconductor.

The temperature of the substrate 60 is higher than or equal to room temperature (25° C.) and lower than or equal to 150° C., preferably higher than or equal to room temperature and lower than or equal to 130° C. Setting the substrate temperature in the above range is suitable for the case of using a large glass substrate (e.g., the 8th- to 10th-generation glass substrates). In particular, when the substrate temperature in deposition of an oxide semiconductor is room temperature, i.e., the substrate is not heated intentionally, the substrate can be favorably prevented from bending or warping.

The substrate 60 may be cooled with a cooling mechanism or the like provided for the substrate holder 62.

When the temperature of the substrate 60 is set to higher than or equal to 100° C. and lower than or equal to 130° C., water in the oxide semiconductor can be removed. Removing water, which is an impurity, in such a manner leads to high field-effect mobility and high reliability.

The temperature of the substrate 60 is set to higher than or equal to 100° C. and lower than or equal to 130° C. for removal of water, whereby the sputtering apparatus can be prevented from warping due to overheat. This leads to an improvement in productivity of a semiconductor device. The productivity is stabilized, so that a large-scale production apparatus is easy to employ. Thus, a large display device including a large substrate can be easily manufactured.

When deposition is performed at a temperature of the substrate 60 of higher than or equal to room temperature and lower than or equal to 150° C., shallow defect states (also referred to as sDOS) in the oxide semiconductor can be reduced.

The second step includes a step of introducing a gas into the deposition chamber.

In the second step, for example, a gas is introduced into the deposition chamber 41 in FIG. 3A. One or more of an argon gas, an oxygen gas, and a nitrogen gas are introduced as the gas. Note that instead of an argon gas, an inert gas such as helium, xenon, or krypton can be used.

In the case where the oxide semiconductor is deposited using an oxygen gas, the lower the oxygen flow rate ratio is, the higher the carrier mobility of the oxide semiconductor can be. Specifically, in a transistor including the oxide semiconductor, the lower the oxygen flow rate ratio is, the more notably the field-effect mobility at a low gate voltage (e.g., higher than 0 V and lower than or equal to 2 V) is increased.

The oxygen flow rate ratio can be appropriately set in the range from 0% to 30% inclusive so that favorable characteristics of the oxide semiconductor suitable to the uses can be obtained. For example, a mixed gas of an argon gas and an oxygen gas can be used as the deposition gas. Furthermore, when the deposition gas containing an oxygen gas is used, the amount of oxygen vacancies in the deposited oxide semiconductor or the deposited oxynitride semiconductor can be reduced. Thus, reduction in the amount of oxygen vacancies can improve the reliability of the oxide semiconductor or the oxynitride semiconductor.

For example, in the case where the oxide semiconductor is used for a semiconductor layer of a transistor having high field-effect mobility, the oxygen flow rate ratio is set to higher than or equal to 0% and lower than or equal to 30%, preferably higher than or equal to 5% and lower than or equal to 30%, further preferably higher than or equal to 7% and lower than or equal to 15% in deposition of the oxide semiconductor.

Even when the sputtering target 10 does not contain nitrogen, an oxynitride semiconductor can be deposited using a deposition gas containing a nitrogen gas. In the case where the oxynitride semiconductor is deposited by adding a nitrogen gas, the higher the nitrogen flow rate ratio is, the higher the carrier mobility of the oxynitride semiconductor can be. Specifically, in a transistor including the oxynitride semiconductor, the higher the nitrogen flow rate ratio is, the more notably the field-effect mobility at a low gate voltage (e.g., higher than 0 V and lower than or equal to 2 V) is increased.

The nitrogen flow rate ratio can be appropriately set in the range from 10% to 100% inclusive so that favorable characteristics of the oxynitride semiconductor suitable to the uses can be obtained. For example, a mixed gas of a nitrogen gas and an argon gas can be used as the deposition gas. Alternatively, a mixed gas of a nitrogen gas and an oxygen gas or a mixed gas of a nitrogen gas, an oxygen gas, and an argon gas may be used.

Furthermore, in the case where the deposition gas contains a nitrogen gas, sites corresponding to the oxygen vacancies in the deposited oxynitride semiconductor can be filled with nitrogen and the amount of oxygen vacancies in the oxynitride semiconductor can be reduced. At this time, in the case where an element that can be strongly bonded to oxygen, such as silicon or aluminum, is used as the element M contained in the sputtering target 10, sites corresponding to the oxygen vacancies in the oxynitride semiconductor can be filled with the element M. Accordingly, the amount of the oxygen vacancies in the oxynitride semiconductor can be reduced even when a deposition gas containing a reduced amount of oxygen or a deposition gas containing no oxygen is used. In addition, reduction in the amount of oxygen and increase in the amount of nitrogen in the oxynitride semiconductor can improve the carrier mobility of the oxynitride semiconductor.

In the case where an oxygen gas is used as a deposition gas in sputtering, the oxygen gas is negatively ionized and the ionized oxygen collides with the oxide semiconductor during deposition. This might damage the oxide semiconductor. In contrast to this, when the deposition gas containing a reduced amount of oxygen or the deposition gas containing no oxygen is used as described above, damage to the oxide semiconductor can be prevented.

In the case where a target containing nitrogen is used as the sputtering target 10, even a deposition gas containing no nitrogen can be used to deposit an oxynitride semiconductor.

It is preferable that the above-described deposition gas be highly purified. For example, as an oxygen gas, a nitrogen gas, or an argon gas used as a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor can be minimized.

The deposition chamber 41 is preferably evacuated to high vacuum (about $5 \times 10^{-7}$ Pa to $1 \times 10^{-4}$ Pa) with an entrapment vacuum evacuation pump such as a cryopump so that water or the like, which is an impurity for the oxide semiconductor, is removed as much as possible. Alternatively, a turbo molecular pump and a cold trap are preferably combined so as to prevent a backflow of a gas, especially a gas containing carbon or hydrogen from an exhaust system to the inside of the chamber. In particular, the partial pressure of gas molecules corresponding to $H_2O$ (gas molecules corresponding to m/z=18) in the chamber in the standby mode of the sputtering apparatus is preferably lower than or equal to $1 \times 10^{-4}$ Pa, further preferably lower than or equal to $5 \times 10^{-5}$ Pa. In addition, the partial pressure of gas molecules corresponding to $H_2O$ (gas molecules corresponding to m/z=18) in the chamber in discharge of the sputtering apparatus is preferably lower than or equal to $5 \times 10^{-5}$ Pa, further preferably lower than or equal to $1 \times 10^{-5}$ Pa. Entry of impurities into the oxide semiconductor is reduced in this manner, whereby a highly reliable transistor can be obtained.

The third step includes a step of applying voltage to the sputtering target 10.

In the third step, for example, voltage is applied to the target holder 52a and the target holder 52b in FIG. 3A. As an example, a potential applied to a terminal V1 connected to the target holder 52a is lower than a potential applied to a terminal V2 connected to the substrate holder 62. A potential applied to a terminal V4 connected to the target holder 52b is lower than the potential applied to the terminal V2 connected to the substrate holder 62. The potential applied to the terminal V2 connected to the substrate holder 62 is a ground potential. A potential applied to a terminal V3 connected to the magnet holder 56 is a ground potential.

Note that the potentials applied to the terminals V1, V2, V3, and V4 are not limited to the above-described potentials. Not all the target holder 52, the substrate holder 62, and the magnet holder 56 are necessarily supplied with potentials. For example, the substrate holder 62 may be electrically floating. Note that it is assumed that a power source capable of controlling a potential applied to the terminal V1 is electrically connected to the terminal V1. As the power source, a DC power source, an AC power source, or an RF power source may be used.

The fourth step includes a step of depositing the oxide semiconductor on the substrate from the sputtering target 10.

In the fourth step, for example, in the deposition chamber 41 in FIG. 3A, an argon gas, a nitrogen gas, or an oxygen gas is ionized and separated into cations and electrons, and plasma is created. Then, the cations in the plasma are accelerated toward the sputtering targets 10a and 10b by the potentials applied to the target holders 52a and 52b. Sputtered particles are generated when the cations collide with the sputtering targets 10a and 10b, and the sputtered particles are deposited on the substrate 60.

FIG. 1B is a schematic view of the vicinity of the sputtering target 10 during deposition of an oxide semiconductor film. In FIG. 1B, the sputtering target 10, plasma 30, a cation 20, first sputtered particles 11a, and second sputtered particles 12a are illustrated.

In FIG. 1B, an argon gas, an oxygen gas, or a nitrogen gas is ionized and separated into the cation 20 and an electron (not illustrated), and the plasma 30 is created. After that, the cation 20 in the plasma 30 is accelerated toward the sputtering target 10. The cation 20 collides with the sputtering target 10, whereby the first sputtered particles 11a and the second sputtered particles 12a are generated and ejected from the sputtering target 10. Since the first sputtered particles 11a are ejected from the first region 11, a cluster including a large amount of the element M (e.g., aluminum or silicon) is formed in some cases. Since the second sputtered particles 12a are ejected from the second region 12, a cluster including a large amount of indium, zinc, or the like is formed in some cases.

The first sputtered particles 11a ejected from the first region 11 including the insulating material and the second sputtered particles 12a ejected from the second region 12 including the conductive material are individually deposited over the substrate. An insulating region including a large number of the first sputtered particles 11a and a conductive region including a large number of the second sputtered particles 12a are formed over the substrate. An oxide semiconductor film and an oxynitride semiconductor film that are deposited using the sputtering target 10 in this manner can each be referred to as a composite oxide semiconductor because they each include the conductive region and the insulating region that are functionally separated from each other. In this specification and the like, such a composite oxide semiconductor is referred to as a cloud-aligned composite oxide semiconductor (CAC-OS). Note that a CAC-OS includes an oxynitride semiconductor.

<Composition of Oxide Semiconductor>

Figure 4:
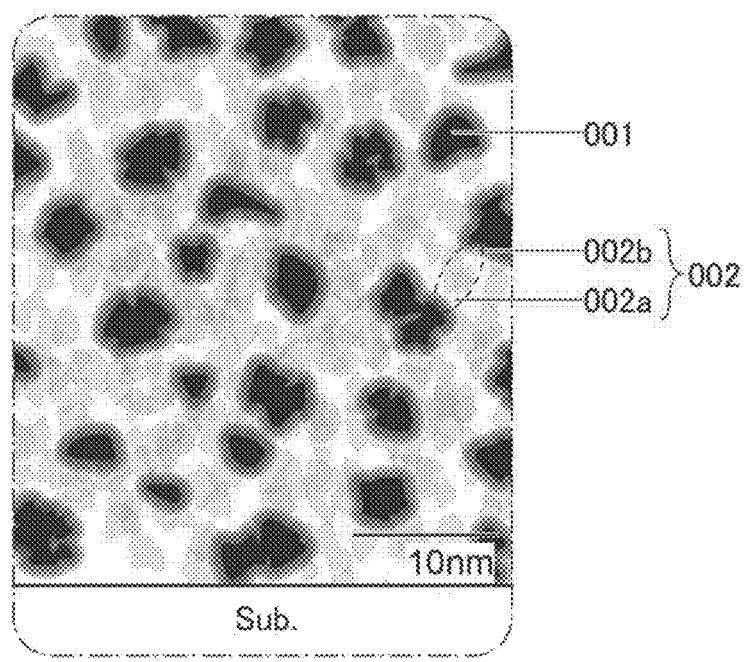
FIG. 4 is a conceptual diagram of a composition of an oxide semiconductor.
Figure 5:
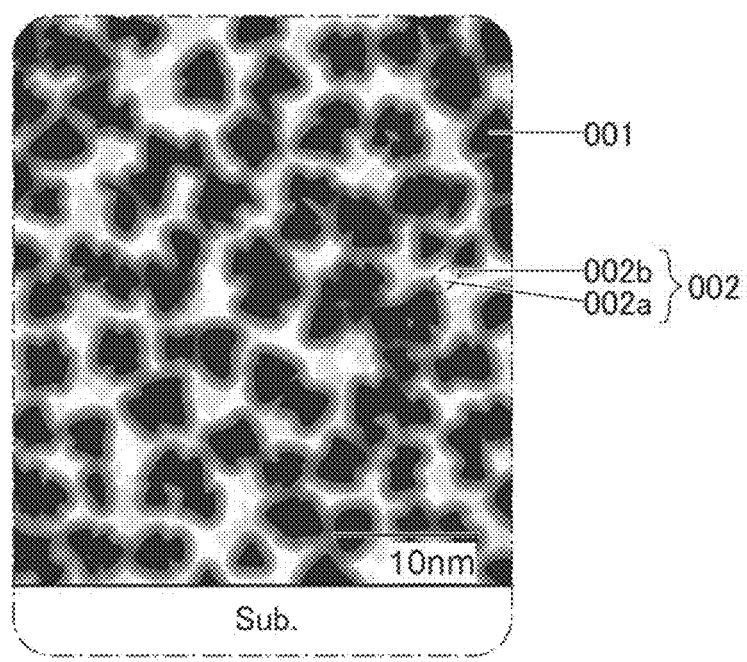
FIG. 5 is a conceptual diagram of a composition of an oxide semiconductor.

FIG. 4 and FIG. 5 are conceptual views of a CAC-OS of the present invention.

As shown in FIG. 4, the CAC-OS includes a first region 001 functioning as an insulating region and a second region 002 functioning as a conductive region. The first region 001 includes the first sputtered particles 11a as a main component, and the second region 002 includes the second sputtered particles 12a as a main component. The second region 002 includes a second region 002a and a second region 002b.

For example, in the CAC-OS, as shown in FIG. 4, elements included in the oxide semiconductor are unevenly distributed, and the first regions 001 mainly including an element, the second regions 002a mainly including another element, and the second regions 002b including another element are formed. The regions 001, 002a, and 002b are mixed to form a mosaic pattern. In other words, the CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

For example, an In-M-Zn oxide with the CAC-OS composition has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and an oxide of the element M ($MO_{X3}$, where X3 is a real number greater than 0) or an M-Zn oxide ($M_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ is distributed in the film. This composition is also referred to as a cloud-like composition.

Let a concept in FIG. 4 show the In-M-Zn oxide with the CAC-OS composition. In this case, it can be said that the first region 001 is a region including $MO_{X3}$ as a main component, the second region 002a is a region including $In_{X2}Zn_{Y2}O_{Z2}$ or $InO_{X1}$ as a main component, and the second region 002b is a region including at least zinc or zinc oxide. Surrounding portions of the region including $MO_{X3}$ as a main component, the region including $In_{X2}Zn_{Y2}O_{Z2}$ or $InO_{X1}$ as a main component, and the region including at least zinc or zinc oxide are unclear (blurred), so that boundaries are not clearly observed in some cases.

That is, the In-M-Zn oxide with the CAC-OS composition is a composite oxide semiconductor with a composition in which the region including $MO_{X3}$ as a main component and the region including $In_{X2}Zn_{Y2}O_{Z2}$ or $InO_{X1}$ as a main component are mixed. Note that in this specification, for example, when the atomic ratio of In to the element M in the second region 002a is greater than the atomic ratio of In to the element M in the first region 001, the second region 002a has higher In concentration than the first region 001.

Note that the sizes of the first region 001, the second region 002a, and the second region 002b can be obtained by EDX mapping. For example, the diameter of the first region 001 is greater than or equal to 0.5 nm and less than or equal to 10 nm, or greater than or equal to 1 nm and less than or equal to 2 nm in the EDX mapping image of a cross-sectional photograph in some cases. The density of an element that is a main component is gradually lowered from the central portion of the region toward the surrounding portion. For example, when the number (abundance) of atoms of an element countable in an EDX mapping image gradually changes from the central portion toward the surrounding portion, the surrounding portion of the region is unclear (blurred) in the EDX mapping of the cross-sectional photograph. For example, from the central portion toward the surrounding portion in the region including $MO_{X3}$ as a main component, the number of the elements M gradually reduces and the number of Zn atoms gradually increases, so that the region including $M_{X4}Zn_{Y4}O_{Z4}$ as a main component gradually appears. Accordingly, the surrounding portion of the region including $MO_{X3}$ as a main component is unclear (blurred) in the EDX mapping image.

FIG. 5 shows a variation of the conceptual view in FIG. 4. As shown in FIG. 5, the shapes or densities of the first region 001, the second region 002a, and the second region 002b might be different from each other depending on formation conditions of the CAC-OS.

The crystallinity of the CAC-OS can be analyzed by electron diffraction. For example, a ring-like region with high luminance is observed in an electron diffraction pattern image. Furthermore, a plurality of spots are observed in the ring-like region in some cases.

Note that in the CAC-OS, a stacked-layer structure including two or more films with different atomic ratios is not included. For example, a two-layer structure of a film including In as a main component and a film including Ga as a main component is not included.

Specifically, of the CAC-OS, an In—Ga—Zn oxide with the CAC-OS composition (such an In—Ga—Zn oxide may be particularly referred to as CAC-IGZO) is described. The In—Ga—Zn oxide with the CAC-OS composition is an oxide semiconductor in which materials are separated into $InO_{X1}$ or $In_{X2}Zn_{Y2}O_{Z2}$, and gallium oxide ($GaO_{X5}$, where X5 is a real number greater than 0) or gallium zinc oxide ($Ga_{X6}Zn_{Y6}O_{Z6}$, where X6, Y6, and Z6 are real numbers greater than 0), for example, and a mosaic pattern is formed. Note that $InO_{X1}$ or $In_{X2}Zn_{Y2}O_{Z2}$ is distributed like a cloud.

That is, the In—Ga—Zn oxide with the CAC-OS composition is a composite oxide semiconductor with a composition in which a region including $GaO_{X5}$ as a main component and a region including $In_{X2}Zn_{Y2}O_{Z2}$ or $InO_{X1}$ as a main component are mixed. Surrounding portions of the region including $GaO_{X5}$ as a main component and the region including $In_{X2}Zn_{Y2}O_{Z2}$ or $InO_{X1}$ as a main component are unclear (blurred), so that boundaries are not clearly observed in some cases.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a c-axis aligned crystalline (CAAC) structure. Note that the CAAC structure is a layered crystal structure in which a plurality of IGZO nanocrystals have c-axis alignment and are connected in the a-b plane direction without alignment.

In the In-M-Zn oxide with the CAC-OS composition, the crystal structure is a secondary element. In this specification, a CAC-OS can be defined as an oxide semiconductor including In, the element M, Zn, and O in the state where a plurality of regions including the element M as a main component and a plurality of regions including In as a main component are each dispersed randomly forming a mosaic pattern.

For example, in the conceptual view shown in FIG. 4, the first region 001 corresponds to the region including the element M as a main component, and the second region 002a corresponds to the region including In as a main component. In addition, the second region 002b corresponds to the region including zinc. The region including the element M as a main component and the region including In as a main component may each be referred to as a nanoparticle. The diameter of the nanoparticle is greater than or equal to 0.5 nm and less than or equal to 10 nm, typically greater than or equal to 1 nm and less than or equal to 2 nm. Surrounding portions of the nanoparticles are unclear (blurred), so that boundaries are not clearly observed in some cases.

Thus, the In-M-Zn oxide with the CAC-OS composition has a structure different from that of an IGZO compound in which metal elements are evenly distributed, and has characteristics different from those of the IGZO compound. For example, in the In—Ga—Zn oxide with the CAC-OS composition, regions including $GaO_{X5}$ or the like as a main component and regions including $In_{X2}Zn_{Y2}O_{Z2}$ or $InO_{X1}$ as a main component are separated to form a mosaic pattern. Accordingly, when CAC-IGZO is used for a semiconductor element, the property derived from $GaO_{X5}$ or the like and the property derived from $In_{X2}Zn_{Y2}O_{Z2}$ or $InO_{X1}$ complement each other, whereby high on-state current (Ion), high field-effect mobility (μ), and low off-state current ($I_{off}$) can be achieved.

As described above, in the CAC-OS, when the first regions 001 are distributed in an oxide semiconductor, leakage current can be suppressed and favorable switching operation can be achieved. In addition, when carriers flow through the second regions 002, the conductivity of an oxide semiconductor is exhibited. Accordingly, when the second regions 002 are distributed in an oxide semiconductor like a cloud, high field-effect mobility (μ) can be achieved.

Accordingly, when the CAC-OS is used for a semiconductor element, the insulating property derived from the first region 001 and the conductivity derived from the second region 002 complement each other, whereby high on-state current ($I_{on}$) and high field-effect mobility (μ) can be achieved.

Note that a conduction mechanism of a semiconductor element including the CAC-OS that achieves high on-state current ($I_{on}$), high field-effect mobility (μ) and low off-state current ($I_{off}$) can be presumed by a random-resistance-network model in percolation theory.

That is, it is basically considered that electric conduction in the CAC-OS is caused when an electron serving as a carrier freely moves in the region that has high conductivity and includes $In_{X2}Zn_{Y2}O_{Z2}$ or $InO_{X1}$ as a main component.

In a region including an oxide of the element M or the like as a main component and in the vicinity thereof, an electron is localized. Thus, in some cases, electric conduction is caused when an electron serving as a carrier hops the region that has an excellent insulating property and includes the oxide of the element M or the like as a main component. Note that it is presumed that a hopping process is caused by thermal vibration of an atom, for example, and electrical conductivity increases with the increasing temperature in some cases. Alternatively, the hopping process is caused by action from the outside, such as electrical action, in some cases. Specifically, the hopping process might be caused when an electric field is applied to a CAC-OS.

Furthermore, a semiconductor element including a CAC-OS has high reliability. Thus, the CAC-OS is suitably used in a variety of semiconductor devices typified by a display.

Furthermore, an oxynitride semiconductor with a CAC-OS composition may be employed. For example, In-M-Zn oxynitride with the CAC-OS composition has a composition in which materials are separated into indium oxynitride ($In_{K1}O_{L2}N_{M1}$, where K1, L1, and M1 are real numbers greater than 0) or indium zinc oxynitride ($In_{K2}Zn_{L2}O_{M2}N_{N2}$, where K2, L2, M2, and N2 are real numbers greater than 0), and oxynitride of the element M ($M_{K3}O_{L3}N_{M3}$, where K3, L3, and M3 are real numbers greater than 0) or M-Zn oxynitride ($M_{K4}Zn_{L4}O_{M4}N_{N4}$, where K4, L4, M4, and N4 are real numbers greater than 0), and a mosaic pattern is formed. Then, $In_{K1}O_{L1}N_{M1}$ of $In_{K2}Zn_{L2}O_{M2}N_{N2}$ is distributed in the film. This composition is also referred to as a cloud-like composition. In the In-M-Zn oxynitride, a nitrogen concentration measured by SIMS is preferably higher than or equal to $1\times10^{18}$ atoms/cm$^3$ and lower than or equal to $1\times10^{23}$ atoms/cm$^3$.

Let a concept in FIG. 4 show the In-M-Zn oxynitride with the CAC-OS composition. In this case, it can be said that the first region 001 is a region including $M_{K3}O_{L3}NM_3$ as a main component, the second region 002a is a region including $In_{K2}Zn_{L2}O_{M2}N_{N2}$ or $In_{K1}O_{L1}N_{M1}$ as a main component, and the second region 002b is a region including at least zinc or zinc oxynitride. Surrounding portions of the region including $M_{K3}O_{L3}N_{M3}$ as a main component, the region including $In_{K2}Zn_{L2}O_{M2}N_{N2}$ or $In_{K1}O_{L1}N_{M1}$ as a main component, and the region including at least zinc or zinc oxynitride are unclear (blurred), so that boundaries are not clearly observed in some cases.

The In-M-Zn oxynitride with the CAC-OS composition is a composite oxynitride semiconductor with a composition in which the region including $M_{K3}O_{L3}N_{M3}$ as a main component and the region including $In_{K2}Zn_{L2}O_{M2}N_{N2}$ or $In_{K1}O_{L1}N_{M1}$ as a main component are mixed.

Thus, in the In-M-Zn oxynitride with the CAC-OS composition, the first regions 001 including $M_{K3}O_{L3}N_{M3}$ or the like as a main component and the second regions 002 including $In_{K2}Zn_{L2}O_{M2}N_{N2}$ or $In_{K1}O_{L1}N_{M1}$ as a main component are separated to form a mosaic pattern. That is, the first region 001 functions as an insulating region, and the second region 002 functions as a conductive region.

Thus, in the CAC-OS, when the first regions 001 are distributed in an oxynitride semiconductor, leakage current can be suppressed and favorable switching operation can be achieved. In addition, when carriers flow through the second regions 002, the conductivity of an oxynitride semiconductor is exhibited. Accordingly, when the second regions 002 are distributed in an oxynitride semiconductor like a cloud, high field-effect mobility (μ) can be achieved.

Accordingly, when the CAC-OS is used for a semiconductor element, the insulating property derived from the first region 001 and the conductivity derived from the second region 002 complement each other, whereby high on-state current (Ion), high field-effect mobility (μ), and low off-state current ($I_{off}$) can be achieved.

Furthermore, an oxynitride semiconductor is formed by adding nitrogen, whereby oxynitride is formed in the second region 002. Oxynitride tends to have a smaller band gap than oxide. Accordingly, the conductivity of the second region 002 can be further increased. When such an oxynitride semiconductor is used in a transistor, the transistor can have higher on-state current ($I_{on}$) and higher field-effect mobility (μ).

Note that as the element M contained in the first region 001, aluminum is preferably used, for example. In addition to the above-described indium oxynitride or indium zinc oxynitride, aluminum oxynitride ($Al_{K5}O_{L5}N_{M5}$, where K5, L5, and M5 are real numbers greater than 0), aluminum zinc oxynitride ($Al_{K6}Zn_{L6}O_{M6}N_{N6}$, where K6, L6, M6, and N6 are real numbers greater than 0), or the like is included in In—Al—Zn oxynitride including aluminum as the element M.

As the element M contained in the first region 001, silicon is preferably used, for example. In addition to the above-described indium oxynitride or indium zinc oxynitride, silicon oxynitride ($Si_{K7}O_{L7}N_{M7}$, where K7, L7, and M7 are real numbers greater than 0), silicon zinc oxynitride ($Si_{K8}Zn_{L8}O_{M8}N_{N8}$, where K8, L8, M8, and N8 are real numbers greater than 0), or the like is included in In—Si—Zn oxynitride including silicon as the element M In the In—Si—Zn oxynitride, a silicon concentration measured by SIMS is preferably higher than or equal to $5\times10^{18}$ atoms/cm$^3$.

Oxynitride is also formed in the first region 001 as in the second region 002. When an element having a wide band gap (e.g., an element having a wider band gap than gallium), such as aluminum or silicon, is used as the element M, the first region 001 can have a sufficient insulating property even when oxynitride is formed. For example, a band gap of $Al_2O_3$ (8.6 eV) is larger than that of $Ga_2O_3$ (4.8 eV), and a band gap of AlN (6.3 eV) is larger than that of GaN (3.5 eV).

Furthermore, when an element that can be strongly bonded to oxygen, such as aluminum or silicon, is used as the element M, sites corresponding to oxygen vacancies in an oxynitride semiconductor can be filled with the element M. Note that the sites corresponding to the oxygen vacancies can also be filled with nitrogen contained in oxynitride. This enables reduction of the amount of the oxygen vacancies in the oxynitride semiconductor even when a deposition gas containing a reduced amount of oxygen or a deposition gas containing no oxygen is used. The use of such an oxynitride semiconductor with reduced oxygen vacancies makes it possible to provide a transistor having high reliability. Thus, a transistor including the CAC-OS is suitably used in a variety of semiconductor devices typified by a display.

When aluminum is used as the element M, $AlN_y$ is formed in an oxynitride semiconductor in some cases. Owing to high thermal conductivity of $AlN_y$, a power device that can withstand high temperatures can be manufactured using a transistor including the oxynitride semiconductor.

As the element M contained in the first region 001, gallium may be used, for example. In addition to the above-described indium oxynitride or indium zinc oxynitride, gallium oxynitride ($Ga_{K9}O_{L9}N_{M9}$, where K9, L9, and M9 are real numbers greater than 0), gallium zinc oxynitride ($Ga_{K10}Zn_{L10}O_{M10}N_{N10}$, where K10, L10, M10, and N10 are real numbers greater than 0), or the like is included in In—Ga—Zn oxynitride including gallium as the element M Note that in the case where gallium is used as the element M, the amount of nitrogen in the first region 001 is preferably selected as appropriate so that the resistance of the first region 001 is not excessively decreased.

<Transistor Including Oxide Semiconductor>

Next, the case where the above-described oxide semiconductor is used for an active layer of a transistor is described.

With the use of the oxide semiconductor in a transistor, the transistor can have high field-effect mobility and high switching characteristics. In addition, the transistor can have high reliability.

A semiconductor with low carrier density is preferably used for the transistor. For example, an oxide semiconductor whose carrier density is lower than $8\times10^{11}/cm^3$, preferably lower than $1\times10^{11}/cm^3$, further preferably lower than $1\times10^{10}/cm^3$, and greater than or equal to $1\times10^{-9}/cm^3$ is used.

A highly purified intrinsic or substantially highly purified intrinsic oxide semiconductor has few carrier generation sources and thus can have a low carrier density. A highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, the transistor whose channel region is formed in the oxide semiconductor having a high density of trap states has unstable electrical characteristics in some cases.

To obtain stable electrical characteristics of the transistor, it is effective to reduce the concentration of impurities in the oxide semiconductor. In order to reduce the concentration of impurities in the oxide semiconductor, the concentration of impurities in a film that is adjacent to the oxide semiconductor is preferably reduced. Examples of impurities include hydrogen, alkali metal, alkaline earth metal, iron, and nickel.

Here, the influence of impurities in the oxide semiconductor is described.

When the oxide semiconductor contains alkali metal or alkaline earth metal, defect states are formed and carriers are generated, in some cases. Thus, a transistor including an oxide semiconductor that contains alkali metal or alkaline earth metal is likely to be normally-on. Accordingly, it is preferable to reduce the concentration of alkali metal or alkaline earth metal in the oxide semiconductor. Specifically, the concentration of alkali metal or alkaline earth metal in the oxide semiconductor, which is measured by SIMS, is lower than or equal to $1\times10^{18}$ atoms/$cm^3$, preferably lower than or equal to $2\times10^{16}$ atoms/$cm^3$.

Hydrogen contained in an oxide semiconductor reacts with oxygen bonded to a metal atom to be water, and thus causes an oxygen vacancy (Vo), in some cases. Due to entry of hydrogen into the oxygen vacancy (Vo), an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1\times10^{20}$ atoms/$cm^3$, preferably lower than $1\times10^{19}$ atoms/$cm^3$, further preferably lower than $5\times10^{18}$ atoms/$cm^3$, and still further preferably lower than $1\times10^{18}$ atoms/$cm^3$.

Note that oxygen vacancies (Vo) in the oxide semiconductor can be reduced by introduction of oxygen into the oxide semiconductor. That is, the oxygen vacancies (Vo) in the oxide semiconductor disappear when the oxygen vacancies (Vo) are filled with oxygen. Accordingly, diffusion of oxygen in the oxide semiconductor can reduce the oxygen vacancies (Vo) in a transistor and improve the reliability of the transistor.

As a method for introducing oxygen into the oxide semiconductor, for example, an oxide in which oxygen content is higher than that in the stoichiometric composition is provided in contact with the oxide semiconductor. That is, in the oxide, a region including oxygen in excess of that in the stoichiometric composition (hereinafter also referred to as an oxygen-excess region) is preferably formed. In particular, in the case of using an oxide semiconductor in a transistor, an oxide including an oxygen-excess region is provided in a base film, an interlayer film, or the like in the vicinity of the transistor, whereby oxygen vacancies in the transistor are reduced, and the reliability can be improved.

When an oxide semiconductor with sufficiently reduced impurity concentration is used for a channel formation region in a transistor, the transistor can have stable electrical characteristics.

The structure described in this embodiment can be combined as appropriate with any of the structures described in the other embodiments.

(Embodiment 2)

In this embodiment, a semiconductor device including the oxide semiconductor or the oxynitride semiconductor described in Embodiment 1 and a manufacturing method of the semiconductor device are described with reference to FIGS. 6A to 6C, FIGS. 7A to 7C, FIGS. 8A and 8B, FIGS. 9A to 9D, FIGS. 10A to 10C, FIGS. 11A to 11C, FIGS. 12A to 12C, FIGS. 13A to 13C, FIGS. 14A to 14C, and FIGS. 15A to 15C.

<Structure Example 1 of Transistor>

Figure 6A:
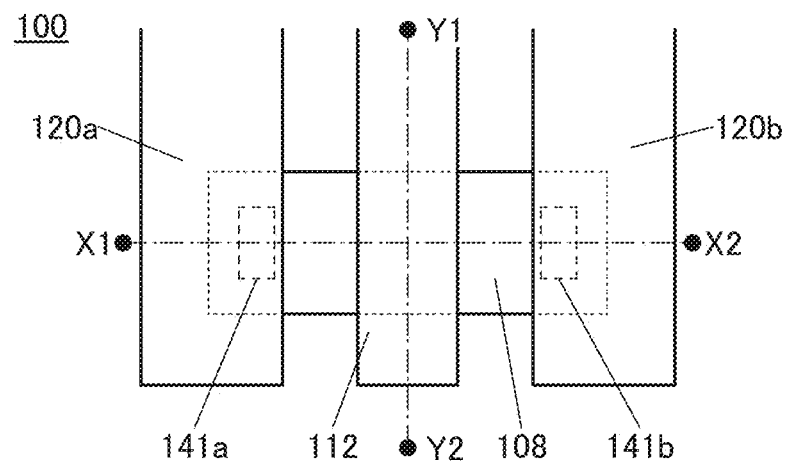
FIGS. 6A to 6C are a top view and cross-sectional views of a semiconductor device.
Figure 6B:
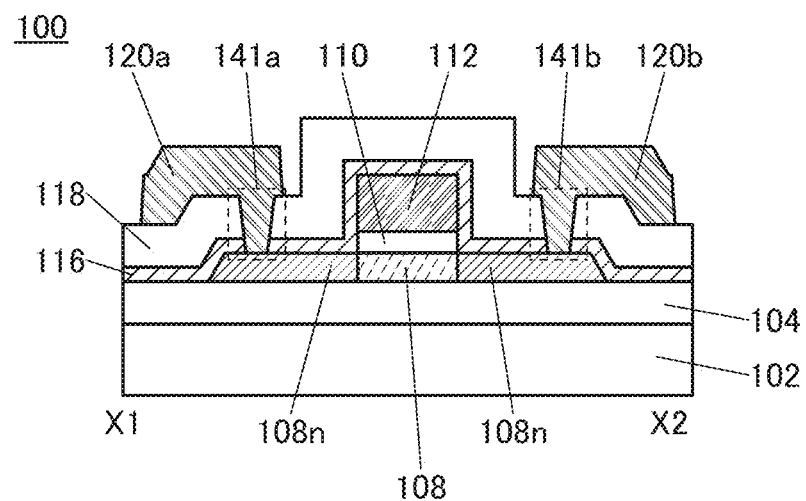
Figure 6C:
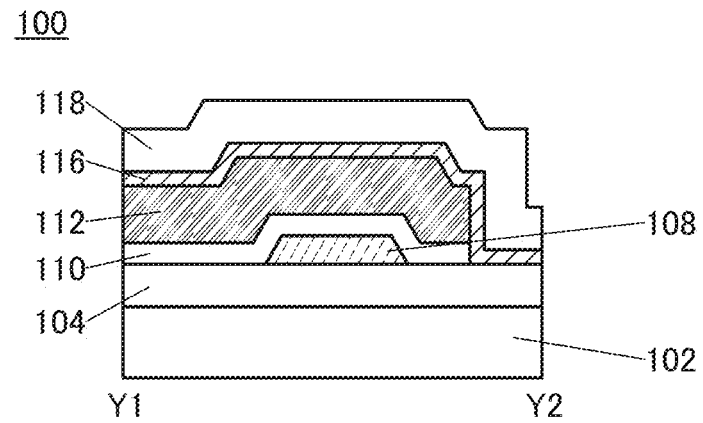

FIG. 6A is a top view of a transistor 100 that is a semiconductor device of one embodiment of the present invention. FIG. 6B is a cross-sectional view taken along the dashed-dotted line X1-X2 in FIG. 6A. FIG. 6C is a cross-sectional view taken along the dashed-dotted line Y1-Y2 in FIG. 6A. Note that in FIG. 6A, some components of the transistor 100 (e.g., an insulating film serving as a gate insulating film) are not illustrated to avoid complexity. The direction of the dashed-dotted line X1-X2 may be called a channel length direction, and the direction of the dashed-dotted line Y1-Y2 may be called a channel width direction. As in FIG. 6A, some components are not illustrated in some cases in top views of transistors described below.

The transistor 100 illustrated in FIGS. 6A to 6C is what is called a top-gate transistor.

The transistor 100 includes an insulating film 104 over a substrate 102; an oxide semiconductor film 108 over the insulating film 104; an insulating film 110 over the oxide semiconductor film 108; a conductive film 112 over the insulating film 110; and an insulating film 116 over the insulating film 104, the oxide semiconductor film 108, and the conductive film 112. The oxide semiconductor film 108 can be formed using the oxide semiconductor or the oxynitride semiconductor described in Embodiment 1.

The oxide semiconductor film 108 over the insulating film 104 includes a channel formation region overlapping with the conductive film 112. For example, the oxide semiconductor film 108 preferably contains In, M (M is one or more of Al, Si, Y, B, Ti, Fe, Ni, Ge, Zr, Mo, La, Ce, Nd, Hf, Ta, W, Mg, V, Be, and Cu), and Zn.

The oxide semiconductor film 108 includes regions 108n which do not overlap with the conductive film 112 and are in contact with the insulating film 116. The regions 108n are n-type regions of the oxide semiconductor film 108 described above. Note that the regions 108n are in contact with the insulating film 116, and the insulating film 116 contains nitrogen or hydrogen. Thus, addition of nitrogen or hydrogen in the insulating film 116 to the regions 108n increases the carrier density, making the regions 108n have n-type conductivity.

The oxide semiconductor film 108 preferably includes a region in which the atomic proportion of In is higher than the atomic proportion of M. For example, the atomic ratio of In to M and Zn in the oxide semiconductor film 108 is preferably In:M:Zn=4:2:3 or a neighborhood of InM:Zn=4:2:3.

Note that the atomic ratio in the oxide semiconductor film 108 is not limited to the above-described atomic ratio. For example, the atomic ratio of In to M and Zn in the oxide semiconductor film 108 may be In:M:Zn=5:1:6 or a neighborhood of In:M:Zn=5:1:6. The term "neighborhood" includes the following: when In is 5, M is greater than or equal to 0.5 and less than or equal to 1.5, and Zn is greater than or equal to 5 and less than or equal to 7.

When the oxide semiconductor film 108 includes a region in which the atomic proportion of In is higher than the atomic proportion of M, the transistor 100 can have high field-effect mobility. Specifically, the field-effect mobility of the transistor 100 can exceed 10 cm$^2$/Vs, preferably exceed 30 cm$^2$/Vs.

For example, the use of the transistor with high field-effect mobility in a gate driver that generates a gate signal allows a display device to have a narrow frame. The use of the transistor with high field-effect mobility in a source driver (particularly in a demultiplexer connected to an output terminal of a shift register included in the source driver) that is included in a display device and supplies a signal from a signal line can reduce the number of wirings connected to the display device.

Even when the oxide semiconductor film 108 includes a region in which the atomic proportion of In is higher than the atomic proportion of M, the field-effect mobility might be low in the case where the oxide semiconductor film 108 has high crystallinity.

Note that the crystallinity of the oxide semiconductor film 108 can be determined by analysis by X-ray diffraction (XRD) or with a transmission electron microscope (TEM).

First, oxygen vacancies that might be formed in the oxide semiconductor film 108 are described.

Oxygen vacancies formed in the oxide semiconductor film 108 adversely affect the transistor characteristics and therefore cause a problem. For example, oxygen vacancies formed in the oxide semiconductor film 108 are bonded to hydrogen to serve as a carrier supply source. The carrier supply source generated in the oxide semiconductor film 108 causes a change in the electrical characteristics, typically, a shift in the threshold voltage, of the transistor 100 including the oxide semiconductor film 108. Therefore, it is preferable that the amount of oxygen vacancies in the oxide semiconductor film 108 be as small as possible.

In view of this, one embodiment of the present invention is a structure in which insulating films in the vicinity of the oxide semiconductor film 108, specifically one or both of the insulating film 110 formed over the oxide semiconductor film 108 and the insulating film 104 formed under the oxide semiconductor film 108 contain excess oxygen. Oxygen or excess oxygen is transferred from one or both of the insulating film 104 and the insulating film 110 to the oxide semiconductor film 108, whereby oxygen vacancies in the oxide semiconductor film can be reduced.

Impurities such as hydrogen or moisture entering the oxide semiconductor film 108 adversely affect the transistor characteristics and therefore cause a problem. Therefore, it is preferable that the amount of impurities such as hydrogen or moisture in the oxide semiconductor film 108 be as small as possible.

Note that it is preferable to use, as the oxide semiconductor film 108, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, a highly purified intrinsic or substantially highly purified intrinsic oxide semiconductor film has an extremely low off-state current; even when an element has a channel width of $1 \times 10^6$ µm and a channel length of 10 µm, the off-state current can be less than or equal to the measurement limit of a semiconductor parameter analyzer, that is, less than or equal to $1 \times 10^{-13}$ A at a voltage (drain voltage) between a source electrode and a drain electrode of from 1 V to 10 V.

As illustrated in FIGS. 6A to 6C, the transistor 100 may further include an insulating film 118 over the insulating film 116, a conductive film 120a electrically connected to the region 108n through an opening 141a formed in the insulating films 116 and 118, and a conductive film 120b electrically connected to the region 108n through an opening 141b formed in the insulating films 116 and 118.

In this specification and the like, the insulating film 104 may be referred to as a first insulating film, the insulating film 110 may be referred to as a second insulating film, the insulating film 116 may be referred to as a third insulating film, and the insulating film 118 may be referred to as a fourth insulating film. The conductive film 112 functions as a gate electrode, the conductive film 120a functions as a source electrode, and the conductive film 120b functions as a drain electrode.

The insulating film 110 functions as a gate insulating film. The insulating film 110 includes an oxygen-excess region. Since the insulating film 110 includes the oxygen-excess region, excess oxygen can be supplied to the oxide semiconductor film 108. As a result, oxygen vacancies that might be formed in the oxide semiconductor film 108 can be filled with excess oxygen, and the semiconductor device can have high reliability.

To supply excess oxygen to the oxide semiconductor film 108, excess oxygen may be supplied to the insulating film 104 that is formed under the oxide semiconductor film 108. In this case, excess oxygen contained in the insulating film 104 might also be supplied to the regions 108n, which is not preferable because the resistance of the regions 108n might be increased. In contrast, in the structure in which the insulating film 110 formed over the oxide semiconductor film 108 contains excess oxygen, excess oxygen can be selectively supplied only to a region overlapping with the conductive film 112.

<Components of Semiconductor Device>

Next, components of the semiconductor device of this embodiment are described in detail.

[Substrate]

There is no particular limitation on a material and the like of the substrate 102 as long as the material has heat resistance high enough to withstand at least heat treatment to be performed later. For example, a glass substrate, a ceramic substrate, a quartz substrate, or a sapphire substrate may be used as the substrate 102. Alternatively, a single crystal semiconductor substrate or a polycrystalline semiconductor substrate of silicon or silicon carbide, a compound semiconductor substrate of silicon germanium or the like, an SOI substrate, or the like can be used, or any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single-layer structure or stacked-layer structure of an oxide insulating film and/or a nitride insulating film. To improve the properties of the interface with the oxide semiconductor film 108, at least a region of the insulating film 104 which is in contact with the oxide semiconductor film 108 is preferably formed using an oxide insulating film. When the insulating film 104 is formed using an oxide insulating film from which oxygen is released by heating, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and interface states at the interface between the insulating film 104 and the oxide semiconductor film 108 and oxygen vacancies included in the oxide semiconductor film 108 can be reduced.

For example, the insulating film 104 can be formed to have a single-layer structure or stacked-layer structure of silicon oxide, silicon oxynitride, silicon nitride oxide, silicon nitride, aluminum oxide, hafnium oxide, gallium oxide, a Ga—Zn oxide, or the like. In this embodiment, the insulating film 104 has a stacked-layer structure of a silicon nitride film and a silicon oxynitride film. With the insulating film 104 having such a stack-layer structure including a silicon nitride film as a lower layer and a silicon oxynitride film as an upper layer, oxygen can be efficiently introduced into the oxide semiconductor film 108.

In the case where the oxynitride semiconductor film described in the above embodiment is used as the oxide semiconductor film 108, oxygen vacancies in the oxide semiconductor film 108 can be reduced by using a nitrogen gas as a deposition gas; accordingly, the amount of oxygen introduced into the oxide semiconductor film 108 can be reduced in some cases. In these cases, silicon nitride, silicon nitride oxide, or the like can be easily used for the insulating film 104. Because nitrogen contained in silicon nitride and silicon nitride oxide is not an impurity for an oxynitride semiconductor, the density of defect states at the interface between the oxide semiconductor film 108 formed using an oxynitride semiconductor and the insulating film 104 formed using silicon nitride or silicon nitride oxide can be reduced.

[Conductive Film]

The conductive film 112 functioning as a gate electrode and the conductive films 120a and 120b functioning as a source electrode and a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

Furthermore, the conductive films 112, 120a, and 120b can be formed using an oxide conductor or an oxide semiconductor, such as an oxide including indium and tin (In—Sn oxide), an oxide including indium and tungsten (In—W oxide), an oxide including indium, tungsten, and zinc (In—W—Zn oxide), an oxide including indium and titanium (In—Ti oxide), an oxide including indium, titanium, and tin (In—Ti—Sn oxide), an oxide including indium and zinc (In—Zn oxide), an oxide including indium, tin, and silicon (In—Sn—Si oxide), or an oxide including indium, gallium, and zinc (In—Ga—Zn oxide).

Here, an oxide conductor is described. In this specification and the like, an oxide conductor may be referred to as OC. Oxygen vacancies are formed in an oxide semiconductor, and then hydrogen is added to the oxygen vacancies, so that a donor level is formed in the vicinity of the conduction band. This increases the conductivity of the oxide semiconductor; accordingly, the oxide semiconductor becomes a conductor. The oxide semiconductor having become a conductor can be referred to as an oxide conductor. Oxide semiconductors generally transmit visible light because of their large energy gap. An oxide conductor is an oxide semiconductor having a donor level in the vicinity of the conduction band. Therefore, the influence of absorption due to the donor level is small in an oxide conductor, and an oxide conductor has a visible light transmitting property comparable to that of an oxide semiconductor.

It is particularly preferred to use the oxide conductor described above as the conductive film 112, in which case excess oxygen can be added to the insulating film 110.

A Cu—X alloy film (X is Mn, Ni, Cr, Fe, Co, Mo, Ta, or Ti) may be used for the conductive films 112, 120a, and 120b. The use of a Cu—X alloy film results in lower fabrication costs because the film can be processed by wet etching.

Among the above-mentioned metal elements, any one or more elements selected from titanium, tungsten, tantalum, and molybdenum are preferably included in the conductive films 112, 120a, and 120b. In particular, a tantalum nitride film is preferably used for the conductive films 112, 120a, and 120b. A tantalum nitride film has conductivity and a high barrier property against copper or hydrogen. Because a tantalum nitride film releases little hydrogen from itself, it is suitable for the conductive film in contact with the oxide semiconductor film 108 or the conductive film in the vicinity of the oxide semiconductor film 108.

The conductive films 112, 120a, and 120b can be formed by electroless plating. As a material that can be deposited by electroless plating, for example, one or more elements selected from Cu, Ni, Al, Au, Sn, Co, Ag, and Pd can be used. It is further favorable to use Cu or Ag because the conductive film can have reduced resistance.

[Second Insulating Film]

As the insulating film 110 functioning as a gate insulating film of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulating film 110 may have a two-layer structure or a layered structure including three or more layers.

The insulating film 110 that is in contact with the oxide semiconductor film 108 functioning as a channel region of the transistor 100 is preferably an oxide insulating film and preferably includes a region containing oxygen in excess of the stoichiometric composition (oxygen-excess region). In other words, the insulating film 110 is an insulating film capable of releasing oxygen. In order to provide the oxygen-excess region in the insulating film 110, the insulating film 110 is formed in an oxygen atmosphere, or the deposited insulating film 110 is subjected to heat treatment in an oxygen atmosphere, for example.

In the case where hafnium oxide is used for the insulating film 110, the following effect is attained. Hafnium oxide has higher dielectric constant than silicon oxide and silicon oxynitride. Therefore, by using hafnium oxide, the thickness of the insulating film 110 can be made large as compared with the case of using silicon oxide; thus, leakage current due to tunnel current can be low. That is, it is possible to provide a transistor with a low off-state current. Moreover, hafnium oxide having a crystal structure has higher dielectric constant than hafnium oxide having an amorphous structure. Therefore, it is preferable to use hafnium oxide having a crystal structure in order to provide a transistor with low off-state current. Examples of the crystal structure include a monoclinic crystal structure and a cubic crystal structure. Note that one embodiment of the present invention is not limited to the above examples.

It is preferable that the insulating film 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 110, a silicon oxide film or a silicon oxynitride film whose spin density of a signal due to the E' center is lower than or equal to $3 \times 10^{17}$ spins/cm$^3$ and preferably lower than or equal to $5 \times 10^{16}$ spins/cm$^3$ may be used.

In the case where the oxynitride semiconductor film described in the above embodiment is used as the oxide semiconductor film 108, oxygen vacancies in the oxide semiconductor film 108 can be reduced by using a nitrogen gas as a deposition gas; accordingly, the amount of oxygen introduced into the oxide semiconductor film 108 can be reduced in some cases. In these cases, silicon nitride, silicon nitride oxide, or the like can be easily used for the insulating film 110. Because nitrogen contained in silicon nitride and silicon nitride oxide is not an impurity for an oxynitride semiconductor, the density of defect states at the interface between the oxide semiconductor film 108 formed using an oxynitride semiconductor and the insulating film 110 formed using silicon nitride or silicon nitride oxide can be reduced.

[Oxide Semiconductor Film]

The oxide semiconductor film 108 can be formed using the oxide semiconductor or the oxynitride semiconductor described in the above embodiment.

<Atomic Ratio>

Preferred ranges of the atomic ratio of indium, the element M, and zinc contained in an oxide semiconductor of the present invention are described below with reference to FIGS. 16A to 16C. Note that the proportion of oxygen atoms is not shown in FIGS. 16A to 16C. The terms of the atomic ratio of indium, the element M, and zinc contained in the oxide semiconductor are denoted by [In], [M], and [Zn], respectively.

Figure 16A:
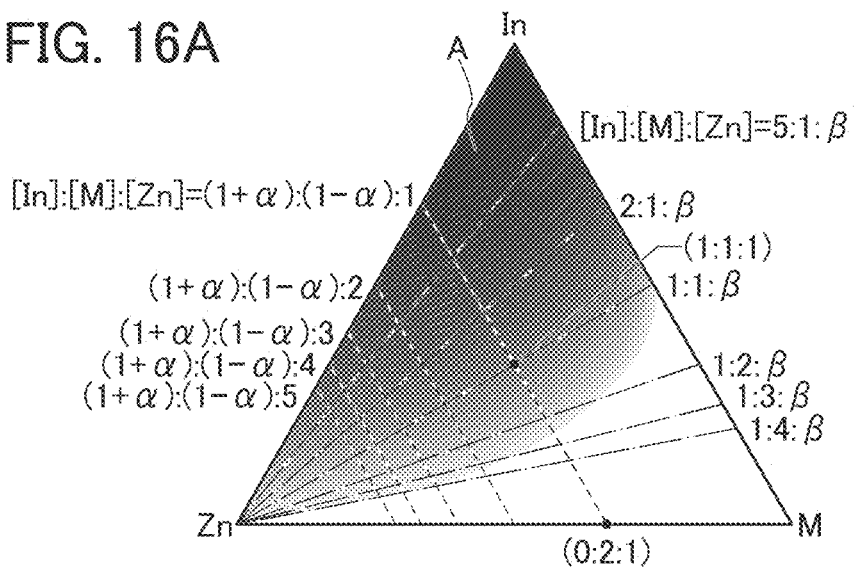
FIGS. 16A to 16C each illustrate an atomic ratio range of an oxide semiconductor of one embodiment of the present invention.
Figure 16B:
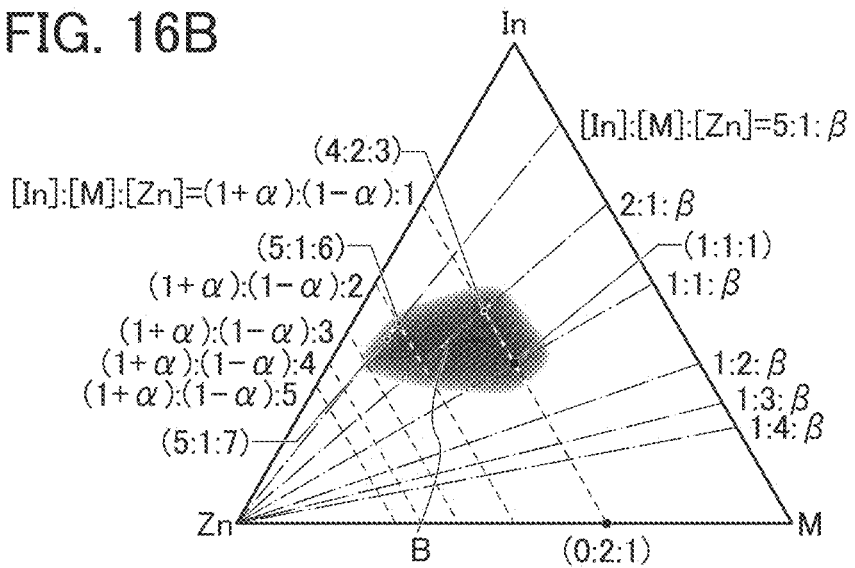
Figure 16C:
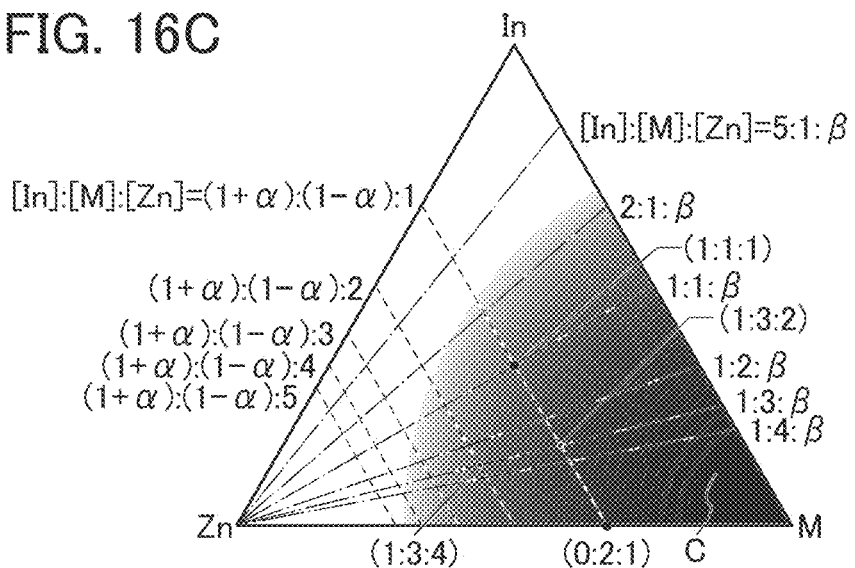

In FIGS. 16A to 16C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is 5:1:$\beta$, where $\beta \geq 0$, a line where the atomic ratio [In]:[M]:[Zn] is 2:1:$\beta$, a line where the atomic ratio [In]:[M]:[Zn] is 1:1:$\beta$, a line where the atomic ratio [In]:

[M]:[Zn] is 1:2:β, a line where the atomic ratio [In]:[M]:[Zn] is 1:3:β, and a line where the atomic ratio [In]:[M]:[Zn] is 1:4:β.

Furthermore, an oxide semiconductor with the atomic ratio [In]:[M]:[Zn] is 0:2:1 or a neighborhood thereof in FIGS. 16A to 16C tends to have a spinel crystal structure.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

A region A in FIG. 16A represents examples of the preferred ranges of the atomic ratio of indium, the element M, and zinc contained in an oxide semiconductor.

In addition, the oxide semiconductor containing indium in a higher proportion can have high carrier mobility (electron mobility). Therefore, an oxide semiconductor having a high content of indium has higher carrier mobility than that of an oxide semiconductor having a low content of indium.

In contrast, when the indium content and the zinc content in an oxide semiconductor become lower, carrier mobility becomes lower. Thus, with an atomic ratio of [In]:[M]:[Zn]= 0:1:0 and the neighborhood thereof (e.g., a region C in FIG. 16C), insulation performance becomes better.

Accordingly, an oxide semiconductor of one embodiment of the present invention preferably has an atomic ratio represented by the region A in FIG. 16A. With the atomic ratio, high carrier mobility is obtained.

An oxide semiconductor having an atomic ratio in the region A, particularly in a region B in FIG. 16B, is excellent because the oxide semiconductor has high carrier mobility and high reliability.

Note that the region B has an atomic ratio of [In]:[M]: [Zn]=4:2:3 to 4:2:4.1 and the neighborhood thereof. The neighborhood includes an atomic ratio of [In]:[M]:[Zn]=5: 3:4. Note that the region B has an atomic ratio of [In]:[M]: [Zn]=5:1:6 and the neighborhood thereof and an atomic ratio of [In]:[M]:[Zn]=5:1:7 and the neighborhood thereof.

Note that the property of an oxide semiconductor is not uniquely determined by an atomic ratio. Even with the same atomic ratio, the property of an oxide semiconductor might be different depending on a formation condition. For example, in the case where the oxide semiconductor is deposited with a sputtering apparatus, a film having an atomic ratio deviated from the atomic ratio of a sputtering target is formed. In particular, [Zn] in the film might be smaller than [Zn] in the sputtering target depending on the substrate temperature in deposition. Thus, the illustrated regions each represent an atomic ratio with which an oxide semiconductor tends to have specific characteristics, and boundaries of the regions A to C are not clear.

Note that the atomic ratio of metal elements in the formed oxide semiconductor film 108 varies from the above atomic ratios of metal elements of the sputtering targets in a range of ±40%. For example, when a sputtering target with an atomic ratio of In to M and Zn of 4:2:4.1 is used, the atomic ratio of In to M and Zn in the formed oxide semiconductor film 108 may be 4:2:3 or a neighborhood of 4:2:3. When a sputtering target with an atomic ratio of In to M and Zn of 5:1:7 is used, the atomic ratio of In to M and Zn in the formed oxide semiconductor film 108 may be 5:1:6 or a neighborhood of 5:1:6.

The energy gap of the oxide semiconductor film 108 is 2 eV or more, preferably 2.5 eV or more. With the use of an oxide semiconductor having such a wide energy gap, the off-state current of the transistor 100 can be reduced.

Furthermore, the oxide semiconductor film 108 preferably has a non-single-crystal structure. Examples of the non-single-crystal structure include a c-axis-aligned crystalline oxide semiconductor (CAAC-OS) which is described later, a polycrystalline structure, a microcrystalline structure, and an amorphous structure. Among the non-single-crystal structure, the amorphous structure has the highest density of defect states.

[Third Insulating Film]

The insulating film 116 contains nitrogen or hydrogen. A nitride insulating film can be used as the insulating film 116, for example. The nitride insulating film can be formed using silicon nitride, silicon nitride oxide, silicon oxynitride, or the like. The hydrogen concentration in the insulating film 116 is preferably higher than or equal to $1 \times 10^{22}$ atoms/cm$^3$. The insulating film 116 is in contact with the region 108n of the oxide semiconductor film 108. Thus, the concentration of an impurity (nitrogen or hydrogen) in the region 108n in contact with the insulating film 116 is increased, leading to an increase in the carrier density of the region 108n.

[Fourth Insulating Film]

As the insulating film 118, an oxide insulating film can be used. Alternatively, a layered film of an oxide insulating film and a nitride insulating film can be used as the insulating film 118. The insulating film 118 can be formed using, for example, silicon oxide, silicon oxynitride, silicon nitride oxide, aluminum oxide, hafnium oxide, gallium oxide, or Ga-Zn oxide.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

<Structure Example 2 of Transistor>

Next, a structure of a transistor different from that in FIGS. 6A to 6C is described with reference to FIGS. 7A to 7C.

Figure 7A:
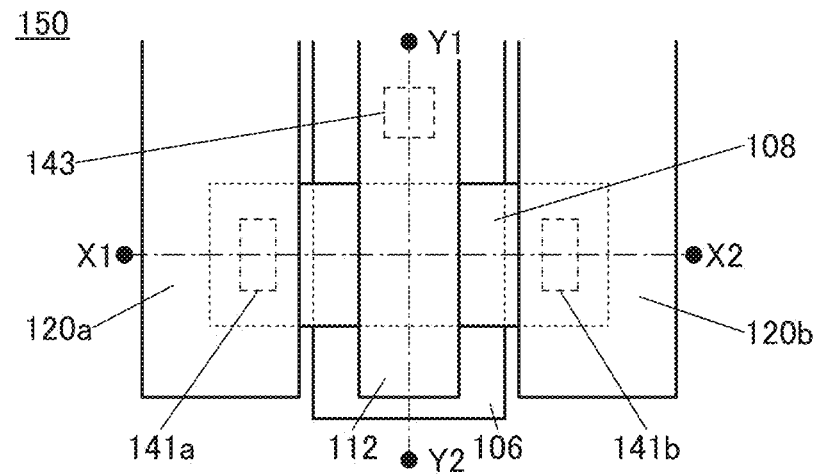
FIGS. 7A to 7C are a top view and cross-sectional views of a semiconductor device.

FIG. 7A is a top view of a transistor 150. FIG. 7B is a cross-sectional view taken along the dashed-dotted line X1-X2 in FIG. 7A. FIG. 7C is a cross-sectional view taken along the dashed-dotted line Y1-Y2 in FIG. 7A.

Figure 7B:
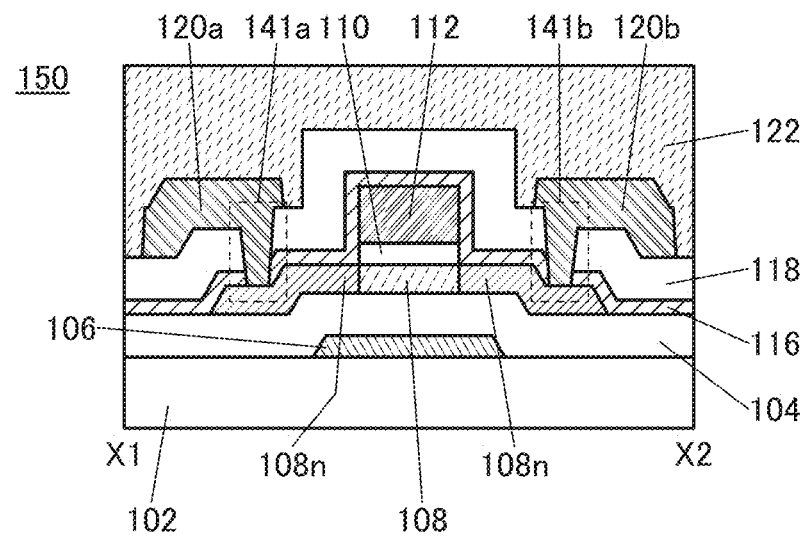
Figure 7C:
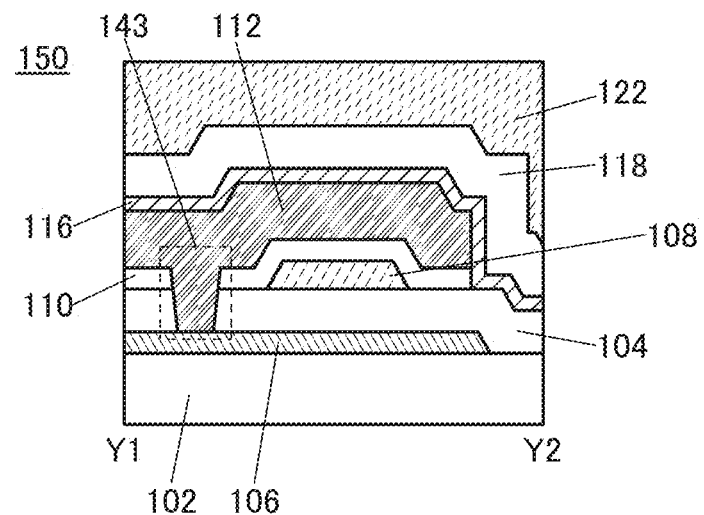

The transistor 150 illustrated in FIGS. 7A to 7C includes a conductive film 106 over the substrate 102; the insulating film 104 over the conductive film 106; the oxide semiconductor film 108 over the insulating film 104; the insulating film 110 over the oxide semiconductor film 108; the conductive film 112 over the insulating film 110; and the insulating film 116 over the insulating film 104, the oxide semiconductor film 108, and the conductive film 112.

Note that the oxide semiconductor film 108 in FIGS. 7A to 7C has a structure similar to that of the oxide semiconductor film 108 included in the transistor 100 in FIGS. 6A to 6C. The transistor 150 illustrated in FIGS. 7A to 7C includes the conductive film 106 and an opening 143 in addition to the components of the transistor 100 described above.

The opening 143 is provided in the insulating films 104 and 110. The conductive film 106 is electrically connected to the conductive film 112 through the opening 143. Thus, the same potential is applied to the conductive film 106 and the conductive film 112. Note that different potentials may be applied to the conductive film 106 and the conductive film 112 without providing the opening 143. Alternatively, the conductive film 106 may be used as a light-blocking film without providing the opening 143. When the conductive film 106 is formed using a light-blocking material, for example, light irradiating the active layer of the oxide semiconductor film 108 from the bottom can be reduced.

In the case of the structure of the transistor 150, the conductive film 106 functions as a first gate electrode (also referred to as bottom gate electrode), and the conductive film 112 functions as a second gate electrode (also referred to as top gate electrode). The insulating film 104 functions as a first gate insulating film, and the insulating film 110 functions as a second gate insulating film.

The conductive film 106 can be formed using a material similar to the above-described materials of the conductive films 112, 120a, and 120b. It is particularly suitable to use a material containing copper for the conductive film 106 because the resistance can be reduced. It is suitable that, for example, each of the conductive films 106, 120a, and 120b has a stacked-layer structure in which a copper film is over a titanium nitride film, a tantalum nitride film, or a tungsten film. In this case, by using the transistor 150 as a pixel transistor and/or a driving transistor of a display device, parasitic capacitance generated between the conductive films 106 and 120a and between the conductive films 106 and 120b can be reduced. Thus, the conductive films 106, 120a, and 120b can be used not only as the first gate electrode, the source electrode, and the drain electrode of the transistor 150, but also as power supply wirings, signal supply wirings, connection wirings, or the like of the display device.

In this manner, unlike the transistor 100 described above, the transistor 150 in FIGS. 7A to 7C has a structure in which a conductive film functioning as a gate electrode is provided over and under the oxide semiconductor film 108. As in the transistor 150, a semiconductor device of one embodiment of the present invention may have a plurality of gate electrodes.

As illustrated in FIGS. 7B and 7C, the oxide semiconductor film 108 faces the conductive film 106 functioning as a first gate electrode and the conductive film 112 functioning as a second gate electrode and is positioned between the two conductive films functioning as the gate electrodes.

Furthermore, the length of the conductive film 112 in the channel width direction is greater than the length of the oxide semiconductor film 108 in the channel width direction. In the channel width direction, the whole oxide semiconductor film 108 is covered with the conductive film 112 with the insulating film 110 placed therebetween. Since the conductive film 112 is connected to the conductive film 106 through the opening 143 provided in the insulating films 104 and 110, a side surface of the oxide semiconductor film 108 in the channel width direction faces the conductive film 112 with the insulating film 110 placed therebetween.

In other words, the conductive film 106 and the conductive film 112 are connected through the opening 143 provided in the insulating films 104 and 110, and each include a region positioned outside an edge portion of the oxide semiconductor film 108.

Such a structure enables the oxide semiconductor film 108 included in the transistor 150 to be electrically surrounded by electric fields of the conductive film 106 functioning as a first gate electrode and the conductive film 112 functioning as a second gate electrode. A device structure of a transistor, like that of the transistor 150, in which electric fields of the first gate electrode and the second gate electrode electrically surround the oxide semiconductor film 108 in which a channel region is formed can be referred to as a surrounded channel (S-channel) structure.

Since the transistor 150 has the S-channel structure, an electric field for inducing a channel can be effectively applied to the oxide semiconductor film 108 by the conductive film 106 or the conductive film 112; thus, the current drive capability of the transistor 150 can be improved and high on-state current characteristics can be obtained. Since the on-state current can be increased, it is possible to reduce the size of the transistor 150. Furthermore, since the transistor 150 has a structure in which the oxide semiconductor film 108 is surrounded by the conductive film 106 and the conductive film 112, the mechanical strength of the transistor 150 can be increased.

When seen in the channel width direction of the transistor 150, an opening different from the opening 143 may be formed on the side of the oxide semiconductor film 108 on which the opening 143 is not formed.

When a transistor has a pair of gate electrodes between which a semiconductor film is positioned as in the transistor 150, one of the gate electrodes may be supplied with a signal A, and the other gate electrode may be supplied with a fixed potential $V_b$. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The signal A is, for example, a signal for controlling the on/off state. The signal A may be a digital signal with two kinds of potentials, a potential V1 and a potential V2 (V1>V2). For example, the potential V1 can be a high power supply potential, and the potential V2 can be a low power supply potential. The signal A may be an analog signal.

The fixed potential $V_b$ is, for example, a potential for controlling a threshold voltage $V_{thA}$ of the transistor. The fixed potential $V_b$ may be the potential V1 or the potential V2. In this case, a potential generator circuit for generating the fixed potential $V_b$ is not necessary, which is preferable. The fixed potential $V_b$ may be different from the potential V1 or the potential V2. When the fixed potential $V_b$ is low, the threshold voltage $V_{thA}$ can be high in some cases. As a result, the drain current flowing when the gate-source voltage $V_{gs}$ is 0 V can be reduced, and leakage current in a circuit including the transistor can be reduced in some cases. The fixed potential $V_b$ may be, for example, lower than the low power supply potential. Meanwhile, a high fixed potential $V_b$ can lower the threshold voltage $V_{thA}$ in some cases. As a result, the drain current flowing when the gate-source voltage $V_{gs}$ is a high power supply potential and the operating speed of the circuit including the transistor can be increased in some cases. The fixed potential $V_b$ may be, for example, higher than the low power supply potential.

The signal B is, for example, a signal for controlling the on/off state. The signal B may be a digital signal with two kinds of potentials, a potential V3 and a potential V4 (V3>V4). For example, the potential V3 can be a high power supply potential, and the potential V4 can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential V1 and the potential V2 of the signal A may be different from the potential V3 and the potential V4 of the signal B. For example, when a gate insulating film for the gate to which the signal B is input is thicker than a gate insulating film for the gate to which the signal A is input, the potential amplitude of the signal B (V3–V4) may be larger than the potential amplitude of the signal A (V1–V2). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor which is, for example, an n-channel transistor can function by itself as a NAND circuit, a NOR circuit, or the like in the following case: the transistor is turned on only when the signal A has the potential V1 and the signal B has the potential V3, or the transistor is turned off only when the signal A has the potential V2 and the signal B has the potential V4. The signal B may be a signal for controlling the threshold voltage $V_{thA}$. For example, the potential of the signal B in a period in which the circuit including the transistor operates may be different from the potential of the signal B in a period in which the circuit does not operate. The potential of the signal B may vary depending on the operation mode of the circuit. In this case, the potential of the signal B is not changed as frequently as the potential of the signal A in some cases.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

The other components of the transistor 150 are similar to those of the transistor 100 described above and have similar effects.

An insulating film may further be formed over the transistor 150. The transistor 150 illustrated in FIGS. 7A to 7C includes an insulating film 122 over the conductive films 120a and 120b and the insulating film 118.

The insulating film 122 has a function of covering unevenness and the like caused by the transistor or the like. The insulating film 122 has an insulating property and is formed using an inorganic material or an organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

<Structure Example 3 of Transistor>

Next, a structure of a transistor different from the structure of the transistor 150 illustrated in FIGS. 7A to 7C is described with reference to FIGS. 8A and 8B.

Figure 8A:
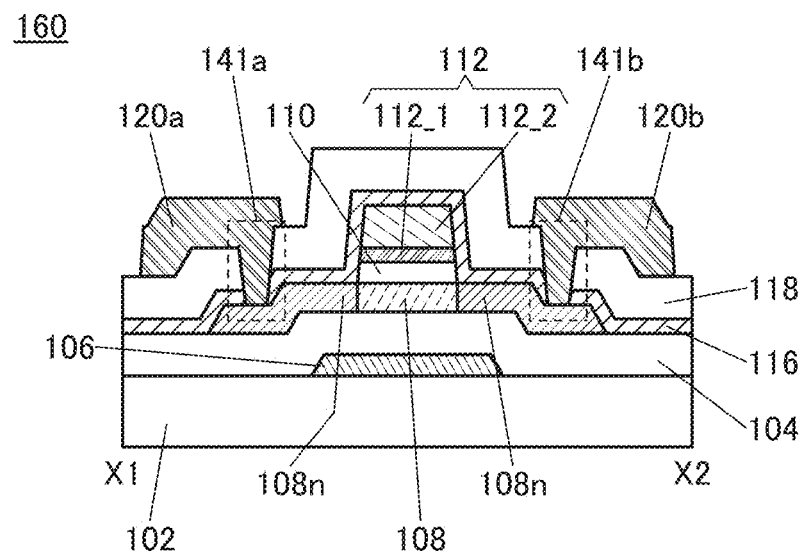
FIGS. 8A and 8B are cross-sectional views of a semiconductor device.
Figure 8B:
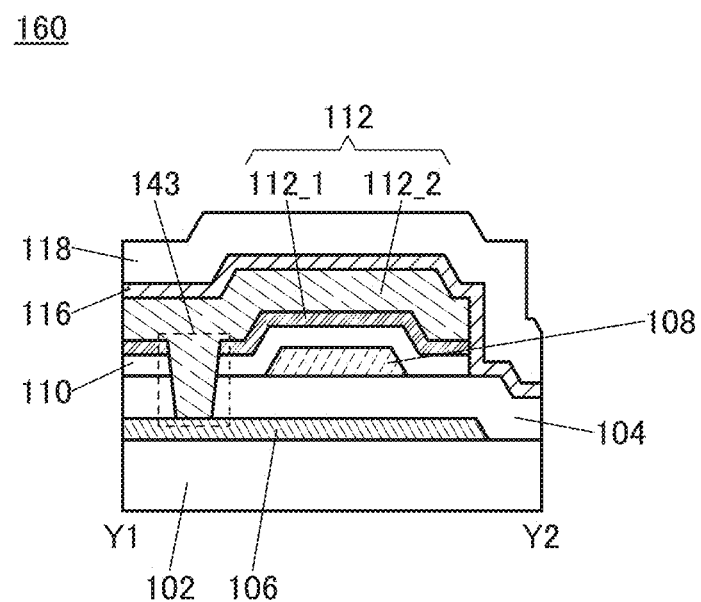

FIGS. 8A and 8B are cross-sectional views of a transistor 160. The top view of the transistor 160 is not illustrated because it is similar to that of the transistor 150 in FIG. 7A.

The transistor 160 illustrated in FIGS. 8A and 8B is different from the transistor 150 in the stacked-layer structure of the conductive film 112, the shape of the conductive film 112, and the shape of the insulating film 110.

The conductive film 112 in the transistor 160 includes a conductive film 112_1 over the insulating film 110 and a conductive film 112_2 over the conductive film 112_1. For example, an oxide conductive film is used as the conductive film 112_1, so that excess oxygen can be added to the insulating film 110. The oxide conductive film can be formed by a sputtering method in an atmosphere containing an oxygen gas. As the oxide conductive film, an oxide including indium and tin, an oxide including tungsten and indium, an oxide including tungsten, indium, and zinc, an oxide including titanium and indium, an oxide including titanium, indium, and tin, an oxide including indium and zinc, an oxide including silicon, indium, and tin, an oxide including indium, gallium, and zinc, or the like can be used, for example.

As illustrated in FIG. 8B, the conductive film 112_2 is connected to the conductive film 106 through the opening 143. By forming the opening 143 after a conductive film to be the conductive film 112_1 is formed, the shape illustrated in FIG. 8B can be obtained. In the case where an oxide conductive film is used as the conductive film 112_1, the structure in which the conductive film 112_2 is connected to the conductive film 106 can decrease the contact resistance between the conductive film 112 and the conductive film 106.

Each of the conductive film 112 and the insulating film 110 of the transistor 160 has a tapered shape. More specifically, the lower edge portion of the conductive film 112 is positioned outside the upper edge portion of the conductive film 112. The lower edge portion of the insulating film 110 is positioned outside the upper edge portion of the insulating film 110. In addition, the lower edge portion of the conductive film 112 is formed in substantially the same position as that of the upper edge portion of the insulating film 110.

As compared with the transistor 160 in which the conductive film 112 and the insulating film 110 each have a rectangular shape, the transistor 160 in which the conductive film 112 and the insulating film 110 each have a tapered shape is favorable because of better coverage with the insulating film 116.

The other components of the transistor 160 are similar to those of the transistor 150 described above and have similar effects.

<Manufacturing Method of Semiconductor Device>

Next, an example of a manufacturing method of the transistor 150 illustrated in FIGS. 7A to 7C is described with reference to FIGS. 9A to 9D, FIGS. 10A to 10C, and FIGS. 11A to 11C. Note that FIGS. 9A to 9D, FIGS. 10A to 10C, and FIGS. 11A to 11C are cross-sectional views in the channel length direction and the channel width direction illustrating the manufacturing method of the transistor 150.

First, the conductive film 106 is formed over the substrate 102. Then, the insulating film 104 is formed over the substrate 102 and the conductive film 106, and an oxide semiconductor film is formed over the insulating film 104. Then, the oxide semiconductor film is processed into an island shape, whereby the oxide semiconductor film 108a is formed (see FIG. 9A).

The conductive film 106 can be formed using a material selected from the above-mentioned materials. In this embodiment, as the conductive film 106, a layered film of a 50-nm-thick tungsten film and a 400-nm-thick copper film is formed with a sputtering apparatus.

To process the conductive film to be the conductive film 106, a wet etching method and/or a dry etching method can be used. In this embodiment, in the processing of the conductive film into the conductive film 106, the copper film is etched by a wet etching method and then the tungsten film is etched by a dry etching method.

The insulating film 104 can be formed by a sputtering method, a CVD method, an evaporation method, a pulsed laser deposition (PLD) method, a printing method, a coating method, or the like as appropriate. In this embodiment, as the insulating film 104, a 400-nm-thick silicon nitride film and a 50-nm-thick silicon oxynitride film are formed with a PECVD apparatus.

After the insulating film 104 is formed, oxygen may be added to the insulating film 104. As oxygen added to the insulating film 104, an oxygen radical, an oxygen atom, an oxygen atomic ion, an oxygen molecular ion, or the like may be used. Oxygen can be added by an ion doping method, an ion implantation method, a plasma treatment method, or the like. Alternatively, a film that suppresses oxygen release may be formed over the insulating film 104, and then, oxygen may be added to the insulating film 104 through the film.

The film that suppresses oxygen release can be formed using a conductive film or a semiconductor film containing one or more of indium, zinc, gallium, tin, aluminum, chromium, tantalum, titanium, molybdenum, nickel, iron, cobalt, and tungsten.

In the case where oxygen is added by plasma treatment in which oxygen is excited by a microwave to generate high-density oxygen plasma, the amount of oxygen added to the insulating film 104 can be increased.

The description of the above embodiment can be referred to for the deposition of the oxide semiconductor film 108a.

The thickness of the oxide semiconductor film 108a is greater than or equal to 3 nm and less than or equal to 200 nm, preferably greater than or equal to 3 nm and less than or equal to 100 nm, and further preferably greater than or equal to 3 nm and less than or equal to 60 nm.

Note that in the case where a large-sized glass substrate (e.g., the 6th generation to the 10th generation) is used as the substrate 102 and the oxide semiconductor film 108a is formed at a substrate temperature higher than or equal to 200° C. and lower than or equal to 300° C., the substrate 102 might be changed in shape (distorted or warped). In the case where a large-sized glass substrate is used, the change in the shape of the glass substrate can be suppressed by forming the oxide semiconductor film 108a at a substrate temperature higher than or equal to room temperature and lower than 200° C.

To process the formed oxide semiconductor film into the oxide semiconductor film 108a, a wet etching method and/or a dry etching method can be used.

After the oxide semiconductor film 108a is formed, the oxide semiconductor film 108a may be dehydrated or dehydrogenated by heat treatment. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert atmosphere containing nitrogen or a rare gas such as helium, neon, argon, xenon, or krypton. Alternatively, the heat treatment may be performed in an inert atmosphere first, and then, in an oxygen atmosphere. It is preferable that the above inert gas atmosphere and the above oxygen atmosphere do not contain hydrogen, water, and the like. The treatment time may be longer than or equal to 3 minutes and shorter than or equal to 24 hours.

An electric furnace, an RTA apparatus, or the like can be used for the heat treatment. The use of an RTA apparatus allows the heat treatment to be performed at a temperature higher than or equal to the strain point of the substrate if the heating time is short. Therefore, the heat treatment time can be shortened.

By depositing the oxide semiconductor film while it is heated or by performing heat treatment after the formation of the oxide semiconductor film, the hydrogen concentration in the oxide semiconductor film, which is measured by SIMS, can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

Figure 9A:
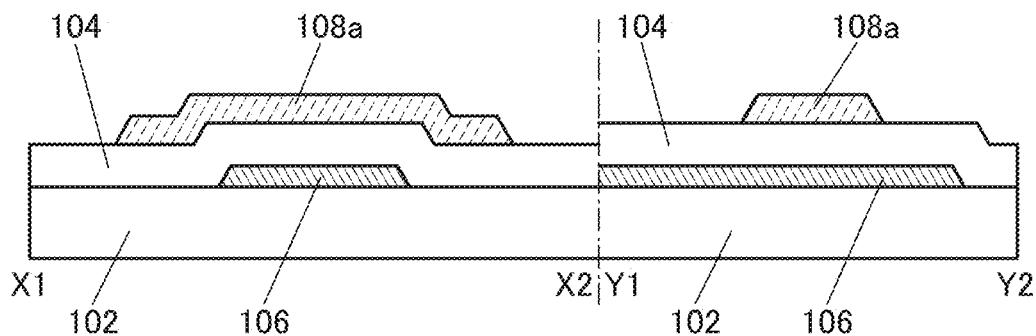
FIGS. 9A to 9D are cross-sectional views illustrating a method for manufacturing a semiconductor device.
Figure 9B:
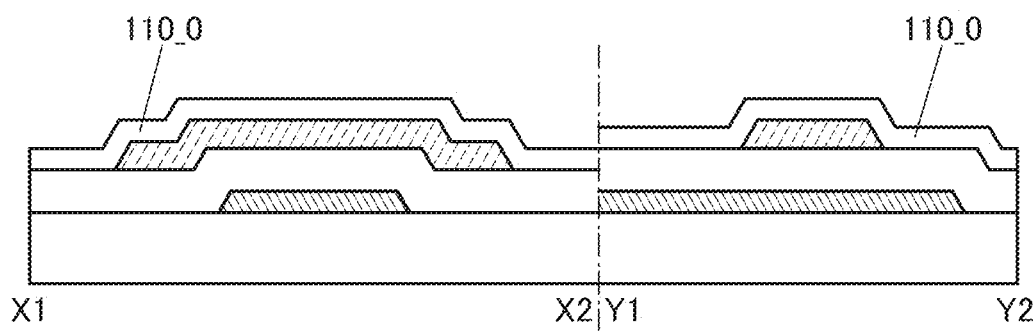

Next, an insulating film 110_0 is formed over the insulating film 104 and the oxide semiconductor film 108a (see FIG. 9B).

As the insulating film 110_0, a silicon oxide film or a silicon oxynitride film can be formed with a plasma-enhanced chemical vapor deposition apparatus (a PECVD apparatus or simply referred to as a plasma CVD apparatus). In this case, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

A silicon oxynitride film having few defects can be formed as the insulating film 110_0 with a PECVD apparatus under the conditions that the flow rate of the oxidizing gas is more than 20 times and less than 100 times, or more than or equal to 40 times and less than or equal to 80 times the flow rate of the deposition gas and that the pressure in a treatment chamber is lower than 100 Pa, or lower than or equal to 50 Pa.

As the insulating film 110_0, a dense silicon oxide film or a dense silicon oxynitride film can be formed under the following conditions: the substrate placed in a vacuum-evacuated treatment chamber of a PECVD apparatus is held at a temperature higher than or equal to 280° C. and lower than or equal to 400° C., the pressure in the treatment chamber into which a source gas is introduced is set to be higher than or equal to 20 Pa and lower than or equal to 250 Pa, preferably higher than or equal to 100 Pa and lower than or equal to 250 Pa, and a high-frequency power is supplied to an electrode provided in the treatment chamber.

The insulating film 110_0 may be formed by a PECVD method using a microwave. A microwave refers to a wave in the frequency range of 300 MHz to 300 GHz. In a microwave, electron temperature and electron energy are low. Furthermore, in supplied power, the proportion of power used for acceleration of electrons is low, and therefore, power can be used for dissociation and ionization of more molecules. Thus, plasma with high density (high-density plasma) can be excited. This method causes little plasma damage to the deposition surface or a deposit, so that the insulating film 110_0 having few defects can be formed.

Alternatively, the insulating film 110_0 can also be formed by a CVD method using an organosilane gas. As the organosilane gas, the following silicon-containing compound can be used: tetraethyl orthosilicate (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane ($SiH(OC_2H_5)_3$); trisdimethylaminosilane ($SiH(N(CH_3)_2)_3$); or the like. By a CVD method using an organosilane gas, the insulating film 110_0 having high coverage can be formed.

In this embodiment, as the insulating film 110_0, a 100-nm-thick silicon oxynitride film is formed with a PECVD apparatus.

Figure 9C:
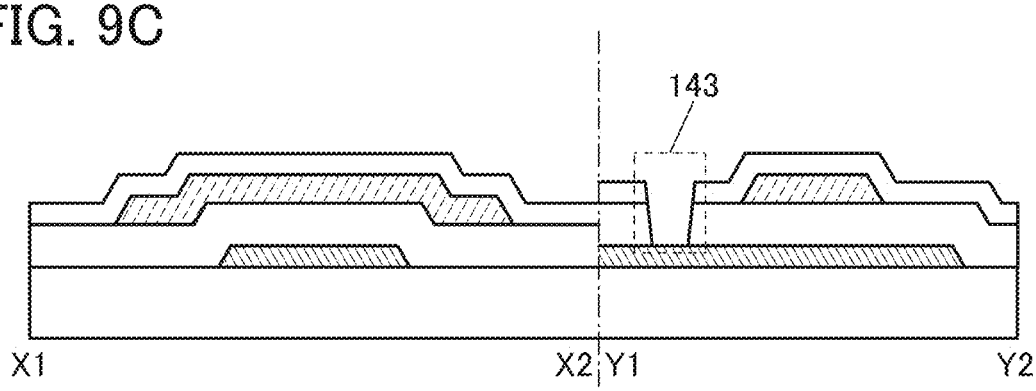

Subsequently, a mask is formed by lithography in a desired position over the insulating film 110_0, and then, the insulating film 110_0 and the insulating film 104 are partly etched, so that the opening 143 reaching the conductive film 106 is formed (see FIG. 9C).

To form the opening 143, a wet etching method and/or a dry etching method can be used. In this embodiment, the opening 143 is formed by a dry etching method.

Next, a conductive film 112_0 is formed over the conductive film 106 and the insulating film 110_0 so as to cover the opening 143. In the case where a metal oxide film is used as the conductive film 112_0, for example, oxygen might be added to the insulating film 110_0 during the formation of the conductive film 112_0 (see FIG. 9D).

Figure 9D:
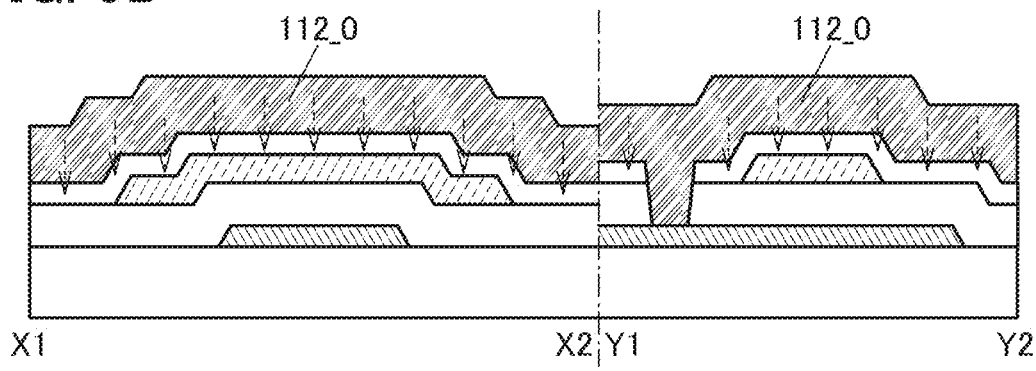

In FIG. 9D, oxygen added to the insulating film 110_0 is schematically shown by arrows. Furthermore, the conductive film 112_0 formed to cover the opening 143 is electrically connected to the conductive film 106.

In the case where a metal oxide film is used as the conductive film 1120, the conductive film 112_0 is preferably formed by a sputtering method in an atmosphere containing an oxygen gas. Formation of the conductive film 112_0 in an atmosphere containing an oxygen gas allows suitable addition of oxygen to the insulating film 110_0. Note that a method for forming the conductive film 112_0 is not limited to a sputtering method, and other methods such as an ALD method may be used.

In this embodiment, a 100-nm-thick IGZO film containing an In—Ga—Zn oxide (In:Ga:Zn=4:2:4.1 [atomic ratio]) is formed as the conductive film 112_0 by a sputtering method. Note that oxygen addition treatment may be performed on the insulating film 110_0 before or after the formation of the conductive film 112_0. The oxygen addition treatment can be performed in a manner similar to that of the oxygen addition that can be performed after the formation of the insulating film 104.

Figure 10A:
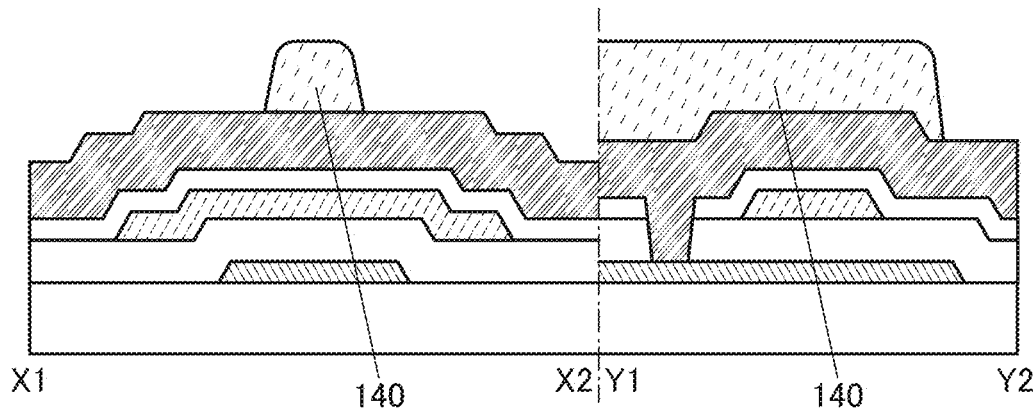
FIGS. 10A to 10C are cross-sectional views illustrating a method for manufacturing a semiconductor device.
Figure 10B:
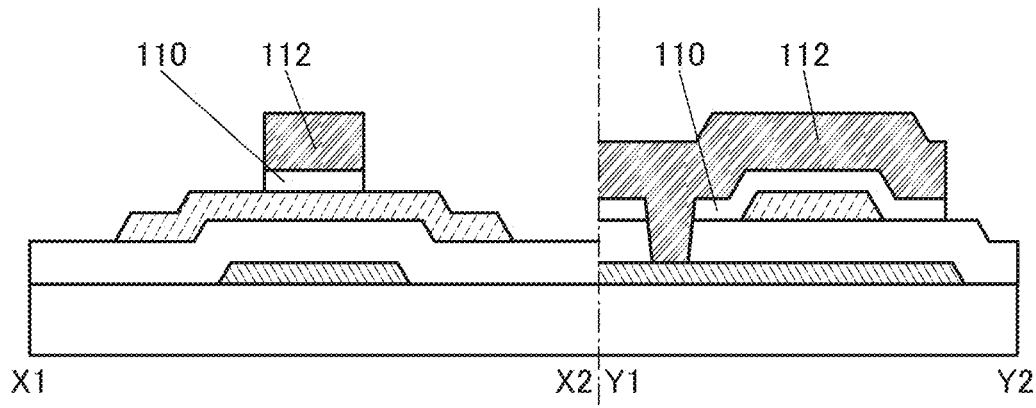
Figure 10C:
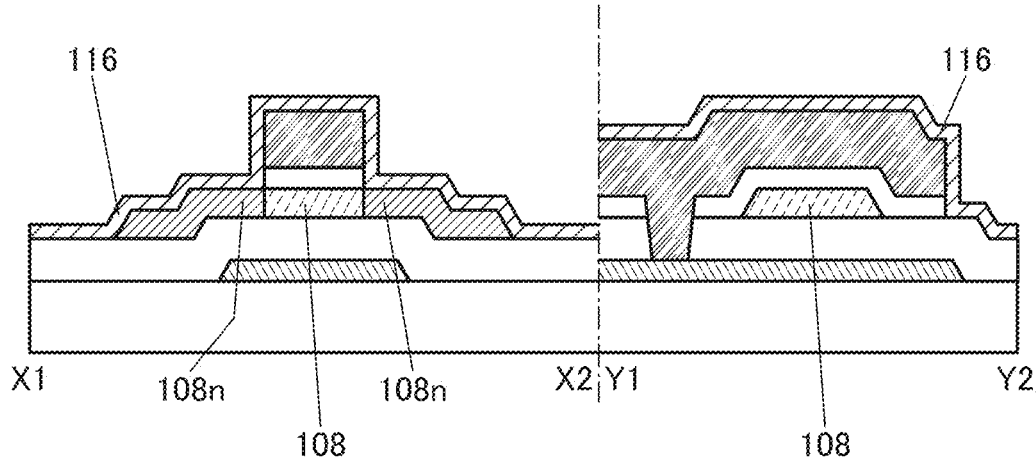

Subsequently, a mask 140 is formed by a lithography process in a desired position over the conductive film 112_0 (see FIG. 10A).

Next, etching is performed from above the mask 140 to process the conductive film 112_0 and the insulating film 110_0. After the processing of the conductive film 112_0 and the insulating film 110_0, the mask 140 is removed. As a result of the processing of the conductive film 112_0 and the insulating film 110_0, the island-shaped conductive film 112 and the island-shaped insulating film 110 are formed (see FIG. 10B).

In this embodiment, the conductive film 112_0 and the insulating film 110_0 are processed by a dry etching method.

In the processing of the conductive film 112 and the insulating film 110, the thickness of the oxide semiconductor film 108a in a region not overlapping with the conductive film 112 is decreased in some cases. In other cases, in the processing of the conductive film 112 and the insulating film 110, the thickness of the insulating film 104 in a region not overlapping with the oxide semiconductor film 108a is decreased. In the processing of the conductive film 112_0 and the insulating film 110_0, an etchant or an etching gas (e.g., chlorine) might be added to the oxide semiconductor film 108a or the constituent element of the conductive film 1120 or the insulating film 110_0 might be added to the oxide semiconductor film 108a.

Next, the insulating film 116 is formed over the insulating film 104, the oxide semiconductor film 108, and the conductive film 112, whereby part of the oxide semiconductor film 108a, which is in contact with the insulating film 116, becomes the region 108n. Note that the oxide semiconductor film 108a overlapping with the conductive film 112 is referred to as the oxide semiconductor film 108 (see FIG. 10C).

The insulating film 116 can be formed using a material selected from the above-mentioned materials. In this embodiment, as the insulating film 116, a 100-nm-thick silicon nitride oxide film is formed with a PECVD apparatus. In the formation of the silicon nitride oxide film, plasma treatment and deposition treatment are performed at 220° C. The plasma treatment is performed under the following conditions: an argon gas at a flow rate of 100 sccm and a nitrogen gas at a flow rate of 1000 sccm are introduced into a chamber before deposition; the pressure in the chamber is set to 40 Pa; and a power of 1000 W is supplied to an RF power source (27.12 MHz). The deposition treatment is performed under the following conditions: a silane gas at a flow rate of 50 sccm, a nitrogen gas at a flow rate of 5000 sccm, and an ammonia gas at a flow rate of 100 sccm are introduced into the chamber; the pressure in the chamber is set to 100 Pa; and power of 1000 W is supplied to the RF power source (27.12 MHz).

When the insulating film 116 includes a silicon nitride oxide film, nitrogen or hydrogen in the silicon nitride oxide film can be supplied to the region 108n in contact with the insulating film 116. In addition, when the formation temperature of the insulating film 116 is the above-mentioned temperature, release of excess oxygen contained in the insulating film 110 to the outside can be suppressed.

Figure 11A:
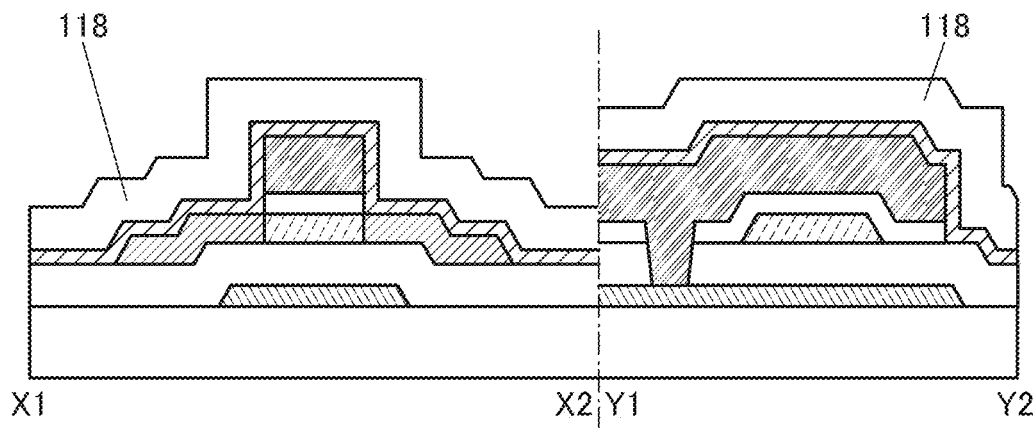
FIGS. 11A to 11C are cross-sectional views illustrating a method for manufacturing a semiconductor device.
Figure 11B:
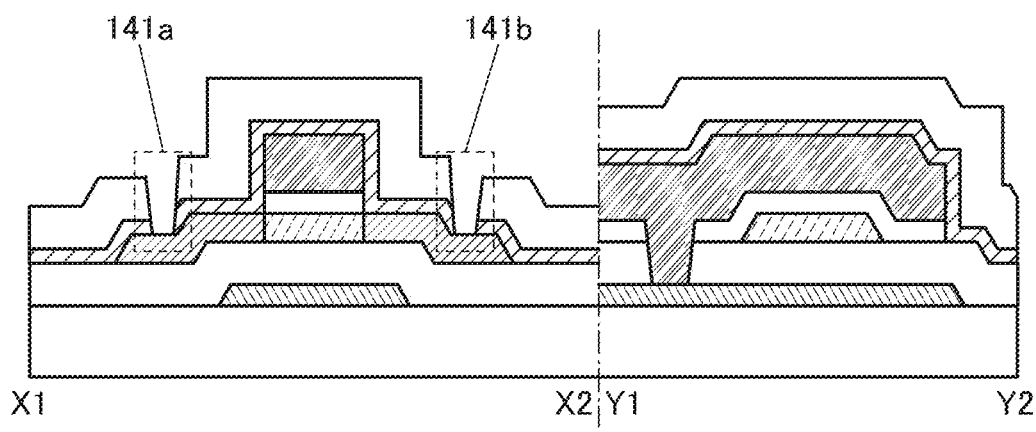

Next, the insulating film 118 is formed over the insulating film 116 (see FIG. 11A).

The insulating film 118 can be formed using a material selected from the above-mentioned materials. In this embodiment, as the insulating film 118, a 300-nm-thick silicon oxynitride film is formed with a PECVD apparatus.

Then, a mask is formed over desired positions of the insulating film 118 by lithography, and the insulating film 118 and the insulating film 116 are partly etched. Thus, the openings 141a and 141b reaching the region 108n are formed (see FIG. 11B).

To etch the insulating film 118 and the insulating film 116, a wet etching method and/or a dry etching method can be used. In this embodiment, the insulating film 118 and the insulating film 116 are processed by a dry etching method.

Figure 11C:
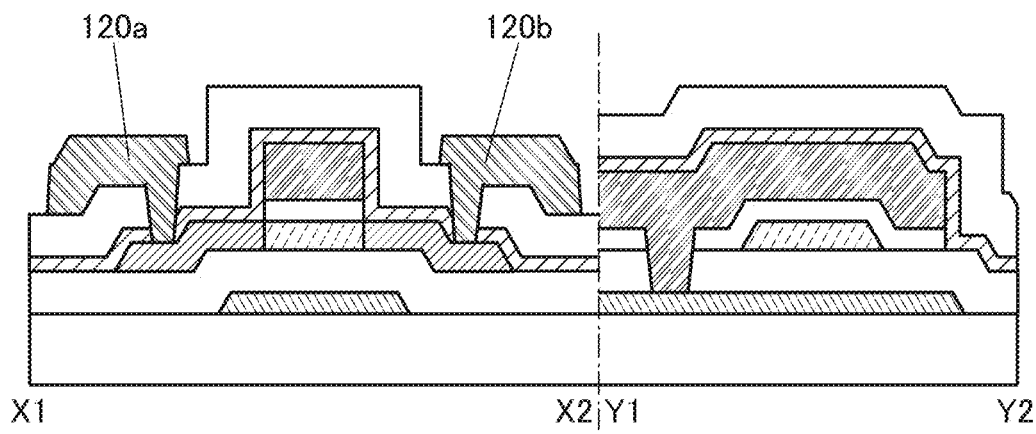

Next, a conductive film is formed over the region 108n and the insulating film 118 to cover the openings 141a and 141b, and processed into desired shapes, so that the conductive films 120a and 120b are formed (see FIG. 11C).

The conductive films 120a and 120b can be formed using a material selected from the above-mentioned materials. In this embodiment, as the conductive films 120a and 120b, a layered film including a 50-nm-thick tungsten film and a 400-nm-thick copper film is formed with a sputtering apparatus.

To process the conductive film to be the conductive films 120a and 120b, a wet etching method and/or a dry etching method can be used. In this embodiment, in the processing of the conductive film into the conductive films 120a and 120b, the copper film is etched by a wet etching method and then the tungsten film is etched by a dry etching method.

Then, the insulating film 122 is formed to cover the conductive films 120a and 120b and the insulating film 118.

Through the above process, the transistor 150 illustrated in FIGS. 7A to 7C can be formed.

Note that the films included in the transistor 150 (the insulating film, the metal oxide film, the oxide semiconductor film, the conductive film, and the like) can be formed by, other than the above methods, a sputtering method, a chemical vapor deposition (CVD) method, a vacuum evaporation method, a pulsed laser deposition (PLD) method, or an ALD method. Alternatively, a coating method or a printing method can be used. Although the sputtering method and a PECVD method are typical examples of the film formation method, a thermal CVD method may be used. As an example of a thermal CVD method, a metal organic chemical vapor deposition (MOCVD) method can be given.

Deposition by the thermal CVD method may be performed in such a manner that the pressure in a chamber is set to an atmospheric pressure or a reduced pressure, and a source gas and an oxidizer are introduced into the chamber at a time and react with each other in the vicinity of the substrate or over the substrate. Thus, no plasma is generated in the deposition; therefore, the thermal CVD method has an advantage that no defect due to plasma damage is caused.

The films such as the conductive films, the insulating films, the oxide semiconductor films, and the metal oxide films that are described above can be formed by a thermal CVD method such as an MOCVD method.

For example, in the case where a hafnium oxide film is formed with a deposition apparatus employing an ALD method, two kinds of gases are used, namely, ozone ($O_3$) as an oxidizer and a source gas that is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) or tetrakis (ethylmethylamide)hafnium).

In the case where an aluminum oxide film is formed with a deposition apparatus employing an ALD method, two kinds of gases are used, namely, $H_2O$ as an oxidizer and a source gas that is obtained by vaporizing liquid containing a solvent and an aluminum precursor (e.g., trimethylaluminum (TMA, $Al(CH_3)_3$)). Examples of another material include tris(dimethylamide)aluminum, triisobutylaluminum, and aluminum tris(2,2,6,6-tetramethyl-3,5-heptanedionate).

In the case where a silicon oxide film is formed with a deposition apparatus employing an ALD method, hexachlorodisilane is adsorbed on a surface on which a film is to be formed, and radicals of an oxidizing gas ($O_2$ or dinitrogen monoxide) are supplied to react with the adsorbate.

In the case where a tungsten film is formed with a deposition apparatus employing an ALD method, a $WF_6$ gas and a $B_2H_6$ gas are sequentially introduced to form an initial tungsten film, and then, a $WF_6$ gas and an $H_2$ gas are used to form a tungsten film. Note that a $SiH_4$ gas may be used instead of a $B_2H_6$ gas.

In the case where an oxide semiconductor film such as an In—Ga—Zn—O film is formed with a deposition apparatus employing an ALD method, an $In(CH_3)_3$ gas and an $O_3$ gas are used to form an In—O layer, a $Ga(CH_3)_3$ gas and an $O_3$ gas are used to form a Ga—O layer, and then, a $Zn(CH_3)_2$ gas and an $O_3$ gas are used to form a Zn—O layer. Note that the order of these layers is not limited to this example. A mixed compound layer such as an In—Ga—O layer, an In—Zn—O layer, or a Ga—Zn—O layer may be formed by using these gases. Note that although an $H_2O$ gas that is obtained by bubbling water with an inert gas such as Ar may be used instead of an $O_3$ gas, it is preferable to use an $O_3$ gas, which does not contain H.

<Structure Example 4 of Transistor>

Figure 12A:
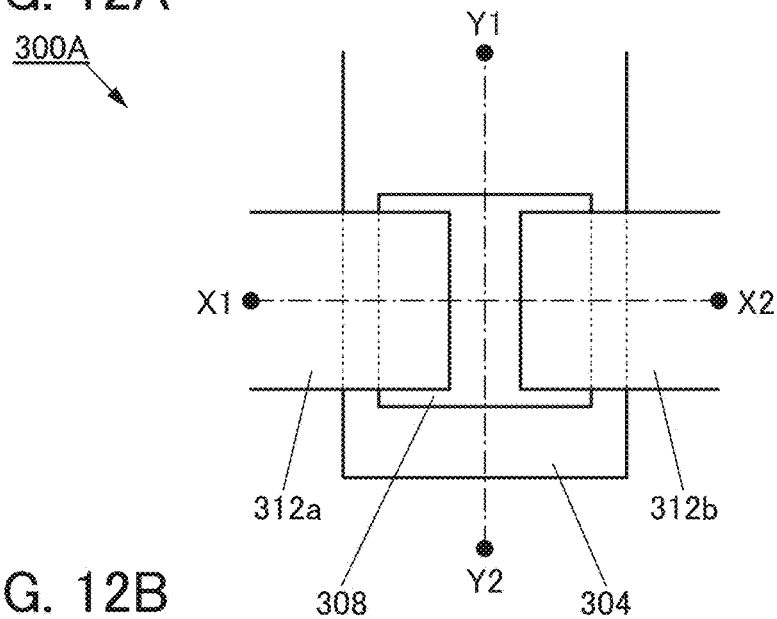
FIGS. 12A to 12C are a top view and cross-sectional views of a semiconductor device.
Figure 12B:
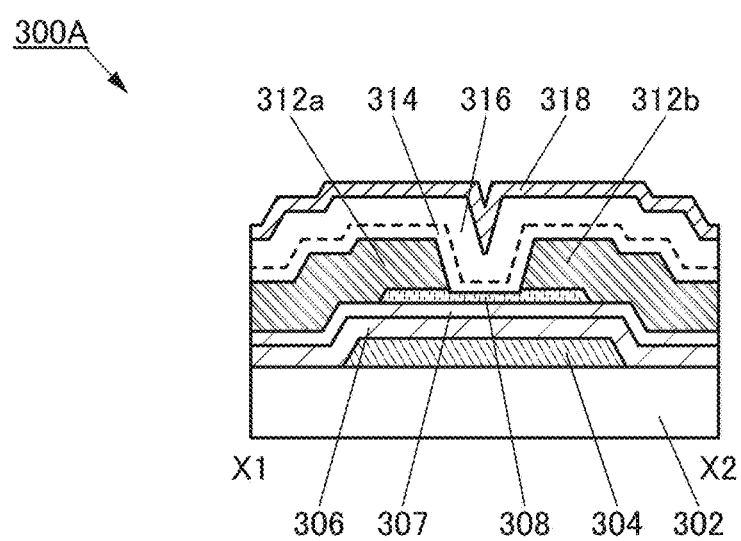
Figure 12C:
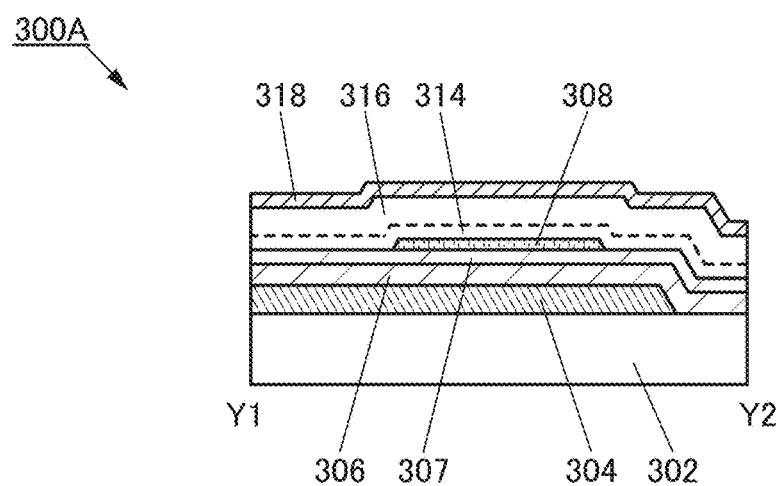

FIG. 12A is a top view of a transistor 300A. FIG. 12B is a cross-sectional view taken along the dashed-dotted line X1-X2 in FIG. 12A. FIG. 12C is a cross-sectional view taken along the dashed-dotted line Y1-Y2 in FIG. 12A. Note that in FIG. 12A, some components of the transistor 300A (e.g., an insulating film functioning as a gate insulating film) are not illustrated to avoid complexity. The direction of the dashed-dotted line X1-X2 may be called a channel length direction, and the direction of the dashed-dotted line Y1-Y2 may be called a channel width direction. As in FIG. 12A, some components are not illustrated in some cases in top views of transistors described below.

The transistor 300A illustrated in FIGS. 12A to 12C includes a conductive film 304 over a substrate 302, an insulating film 306 over the substrate 302 and the conductive film 304, an insulating film 307 over the insulating film 306, an oxide semiconductor film 308 over the insulating film 307, a conductive film 312a over the oxide semiconductor film 308, and a conductive film 312b over the oxide semiconductor film 308. Over the transistor 300A, specifically, over the conductive films 312a and 312b and the oxide semiconductor film 308, an insulating film 314, an insulating film 316, and an insulating film 318 are provided.

In the transistor 300A, the insulating films 306 and 307 function as gate insulating films of the transistor 300A, and the insulating films 314, 316, and 318 function as protective insulating films of the transistor 300A. Furthermore, in the transistor 300A, the conductive film 304 functions as a gate electrode, the conductive film 312a functions as a source electrode, and the conductive film 312b functions as a drain electrode.

In this specification and the like, the insulating films 306 and 307 may be referred to as a first insulating film, the insulating films 314 and 316 may be referred to as a second insulating film, and the insulating film 318 may be referred to as a third insulating film.

The transistor 300A illustrated in FIGS. 12A to 12C is a channel-etched transistor. The oxide semiconductor film of one embodiment of the present invention is suitable for a channel-etched transistor.

<Structure Example 5 of Transistor>

Figure 13A:
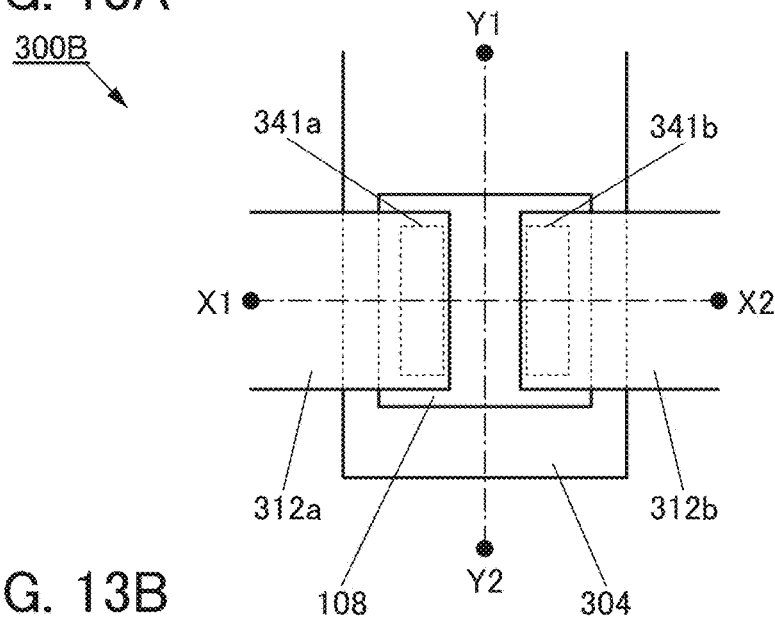
FIGS. 13A to 13C are a top view and cross-sectional views of a semiconductor device.
Figure 13B:
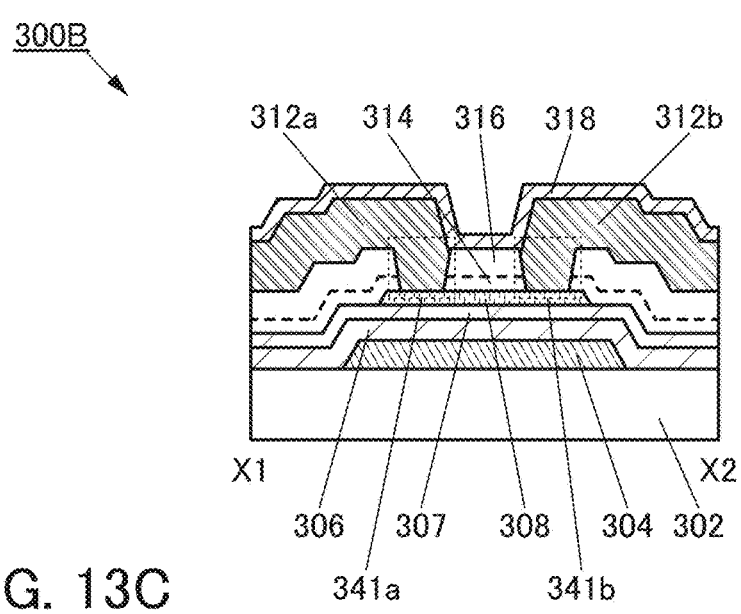
Figure 13C:
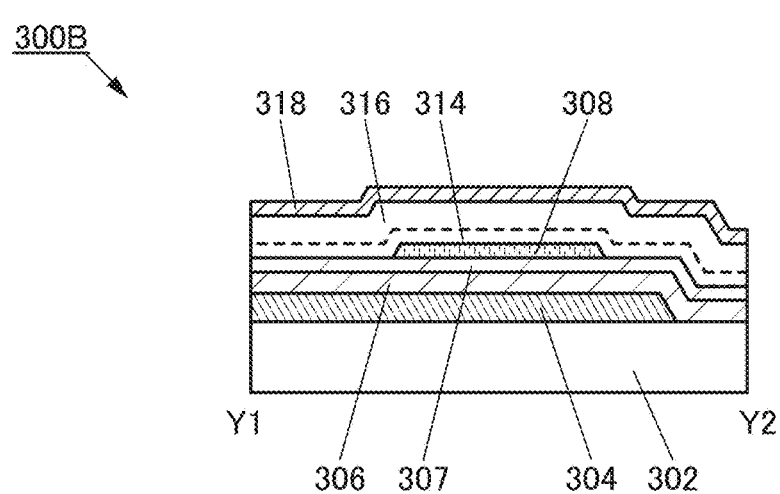

FIG. 13A is a top view of a transistor 300B. FIG. 13B is a cross-sectional view taken along the dashed-dotted line X1-X2 in FIG. 13A. FIG. 13C is a cross-sectional view taken along the dashed-dotted line Y1-Y2 in FIG. 13A.

The transistor 300B illustrated in FIGS. 13A to 13C includes the conductive film 304 over the substrate 302, the insulating film 306 over the substrate 302 and the conductive film 304, the insulating film 307 over the insulating film 306, the oxide semiconductor film 308 over the insulating film 307, the insulating film 314 over the oxide semiconductor film 308, the insulating film 316 over the insulating film 314, the conductive film 312a electrically connected to the oxide semiconductor film 308 through an opening 341*a* provided in the insulating films 314 and 316, and the conductive film 312*b* electrically connected to the oxide semiconductor film 308 through an opening 341*b* provided in the insulating films 314 and 316. Over the transistor 300B, specifically, over the conductive films 312*a* and 312*b* and the insulating film 316, the insulating film 318 is provided.

In the transistor 300B, the insulating films 306 and 307 function as gate insulating films of the transistor 300B, the insulating films 314 and 316 function as protective insulating films of the oxide semiconductor film 308, and the insulating film 318 functions as a protective insulating film of the transistor 300B. Furthermore, in the transistor 300B, the conductive film 304 functions as a gate electrode, the conductive film 312*a* functions as a source electrode, and the conductive film 312*b* functions as a drain electrode.

The transistor 300A illustrated in FIGS. 12A to 12C has a channel-etched structure, whereas the transistor 300B illustrated in FIGS. 13A to 13C has a channel-protective structure. The oxide semiconductor film of one embodiment of the present invention is suitable for a channel-protective transistor as well.

<Structure Example 6 of Transistor>

Figure 14A:
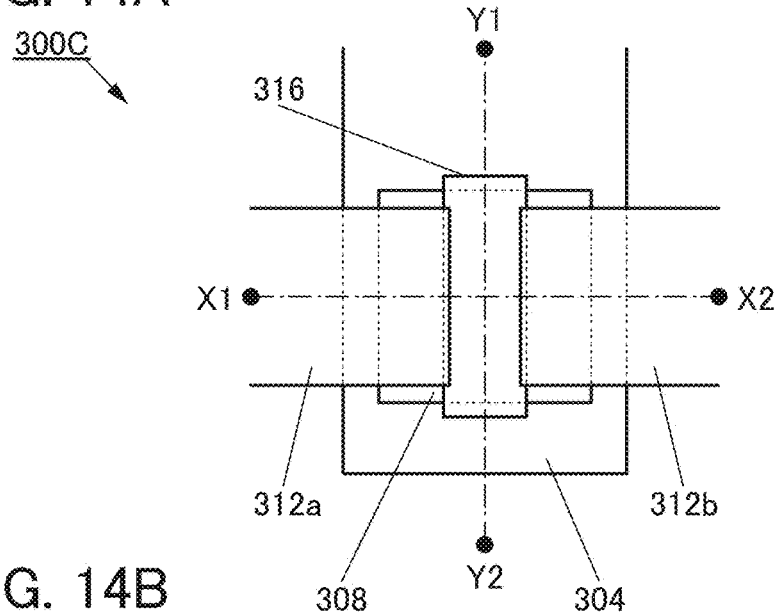
FIGS. 14A to 14C are a top view and cross-sectional views of a semiconductor device.
Figure 14B:
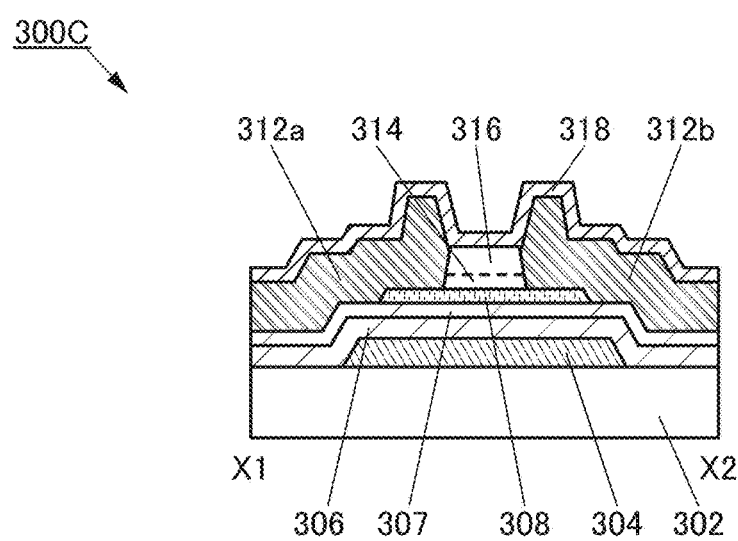
Figure 14C:
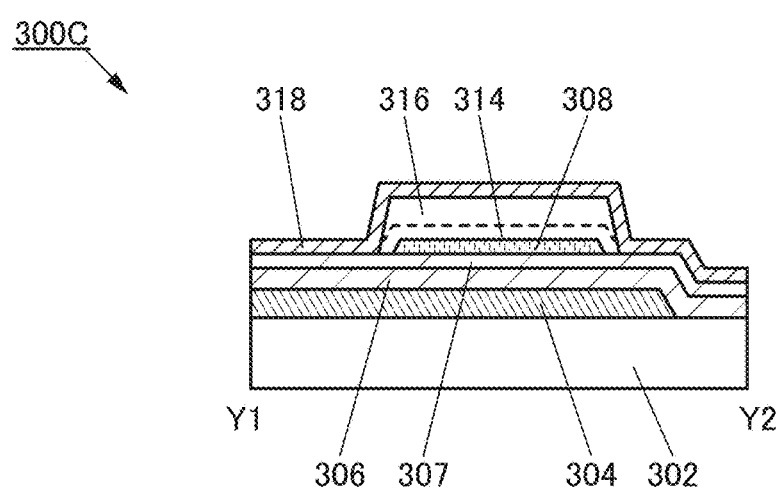

FIG. 14A is a top view of a transistor 300C. FIG. 14B is a cross-sectional view taken along the dashed-dotted line X1-X2 in FIG. 14A. FIG. 14C is a cross-sectional view taken along the dashed-dotted line Y1-Y2 in FIG. 14A.

The transistor 300C illustrated in FIGS. 14A to 14C is different from the transistor 300B illustrated in FIGS. 13A to 13C in the shapes of the insulating films 314 and 316. Specifically, the insulating films 314 and 316 of the transistor 300C have island shapes and are provided over a channel region of the oxide semiconductor film 308. Other components are similar to those of the transistor 300B.

<Structure Example 7 of Transistor>

Figure 15A:
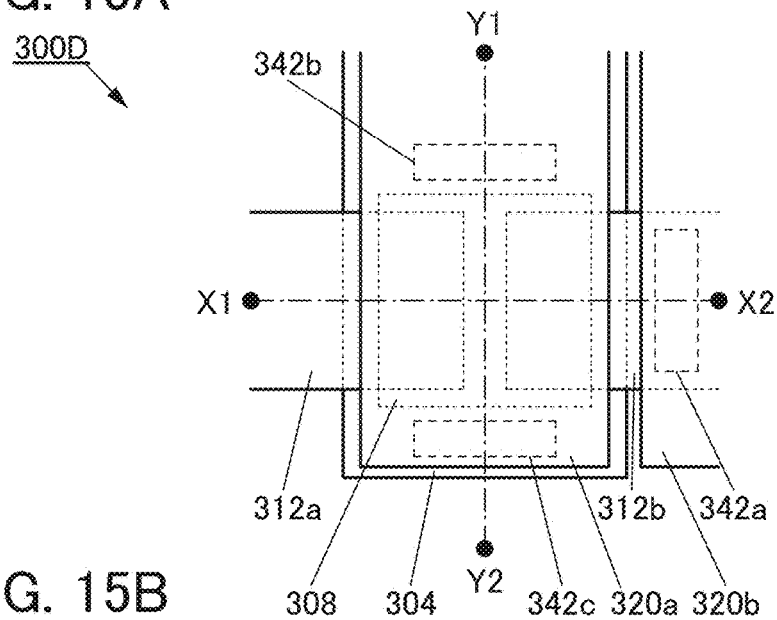
FIGS. 15A to 15C are a top view and cross-sectional views of a semiconductor device.
Figure 15B:
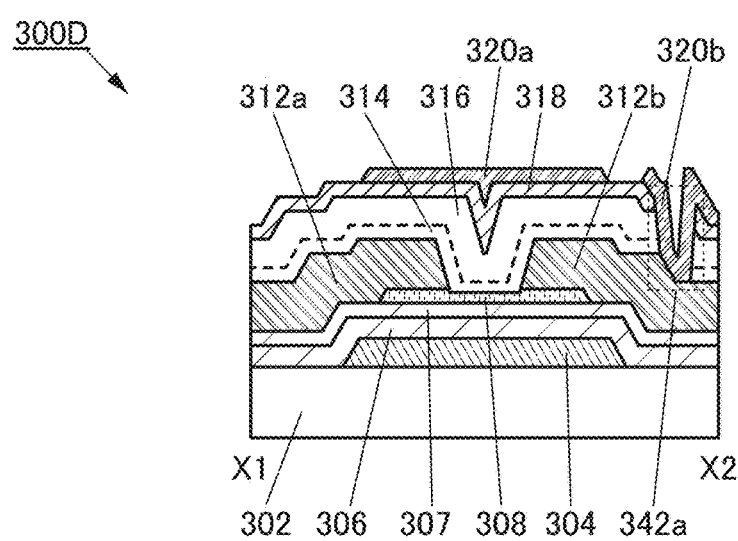
Figure 15C:
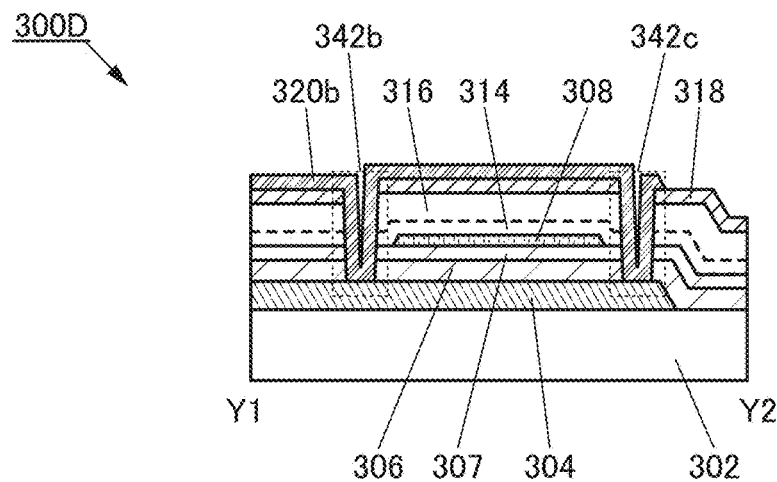

FIG. 15A is a top view of a transistor 300D. FIG. 15B is a cross-sectional view taken along the dashed-dotted line X1-X2 in FIG. 15A. FIG. 15C is a cross-sectional view taken along the dashed-dotted line Y1-Y2 in FIG. 15A.

The transistor 300D illustrated in FIGS. 15A to 15C includes the conductive film 304 over the substrate 302, the insulating film 306 over the substrate 302 and the conductive film 304, the insulating film 307 over the insulating film 306, the oxide semiconductor film 308 over the insulating film 307, the conductive film 312*a* over the oxide semiconductor film 308, the conductive film 312*b* over the oxide semiconductor film 308, the insulating film 314 over the oxide semiconductor film 308 and the conductive films 312*a* and 312*b*, the insulating film 316 over the insulating film 314, the insulating film 318 over the insulating film 316, and conductive films 320*a* and 320*b* over the insulating film 318.

In the transistor 300D, the insulating films 306 and 307 function as first gate insulating films of the transistor 300D, and the insulating films 314, 316, and 318 function as second gate insulating films of the transistor 300D. Furthermore, in the transistor 300D, the conductive film 304 functions as a first gate electrode, the conductive film 320*a* functions as a second gate electrode, and the conductive film 320*b* functions as a pixel electrode used for a display device. The conductive film 312*a* functions as a source electrode, and the conductive film 312*b* functions as a drain electrode.

As illustrated in FIG. 15C, the conductive film 320*a* is connected to the conductive film 304 in an opening 342*b* and an opening 342*c* provided in the insulating films 306, 307, 314, 316, and 318. Thus, the same potential is applied to the conductive film 320*a* and the conductive film 304.

The structure of the transistor 300D is not limited to that described above, in which the openings 342*b* and 342*c* are provided so that the conductive film 320*a* is connected to the conductive film 304. For example, a structure in which only one of the openings 342*b* and 342*c* is provided so that the conductive film 320*a* is connected to the conductive film 304, or a structure in which the openings 342*b* and 342*c* are not provided and the conductive film 320*a* is not connected to the conductive film 304 may be employed. Note that in the case where the conductive film 320*a* is not connected to the conductive film 304, it is possible to apply different potentials to the conductive film 320*a* and the conductive film 304.

The conductive film 320*b* is connected to the conductive film 312*b* through an opening 342*a* provided in the insulating films 314, 316, and 318.

Note that the transistor 300D has the S-channel structure described above.

At least part of this embodiment can be implemented in combination with any of the other embodiments described in this specification as appropriate.

(Embodiment 3)

In this embodiment, an example of a display panel that can be used for a display portion or the like in a display device including the semiconductor device of one embodiment of the present invention is described with reference to FIG. 17 and FIG. 18. The display panel described below as an example includes both a reflective liquid crystal element and a light-emitting element and can display an image in both the transmissive mode and the reflective mode.

<Structure Example of Display Panel>

Figure 17:
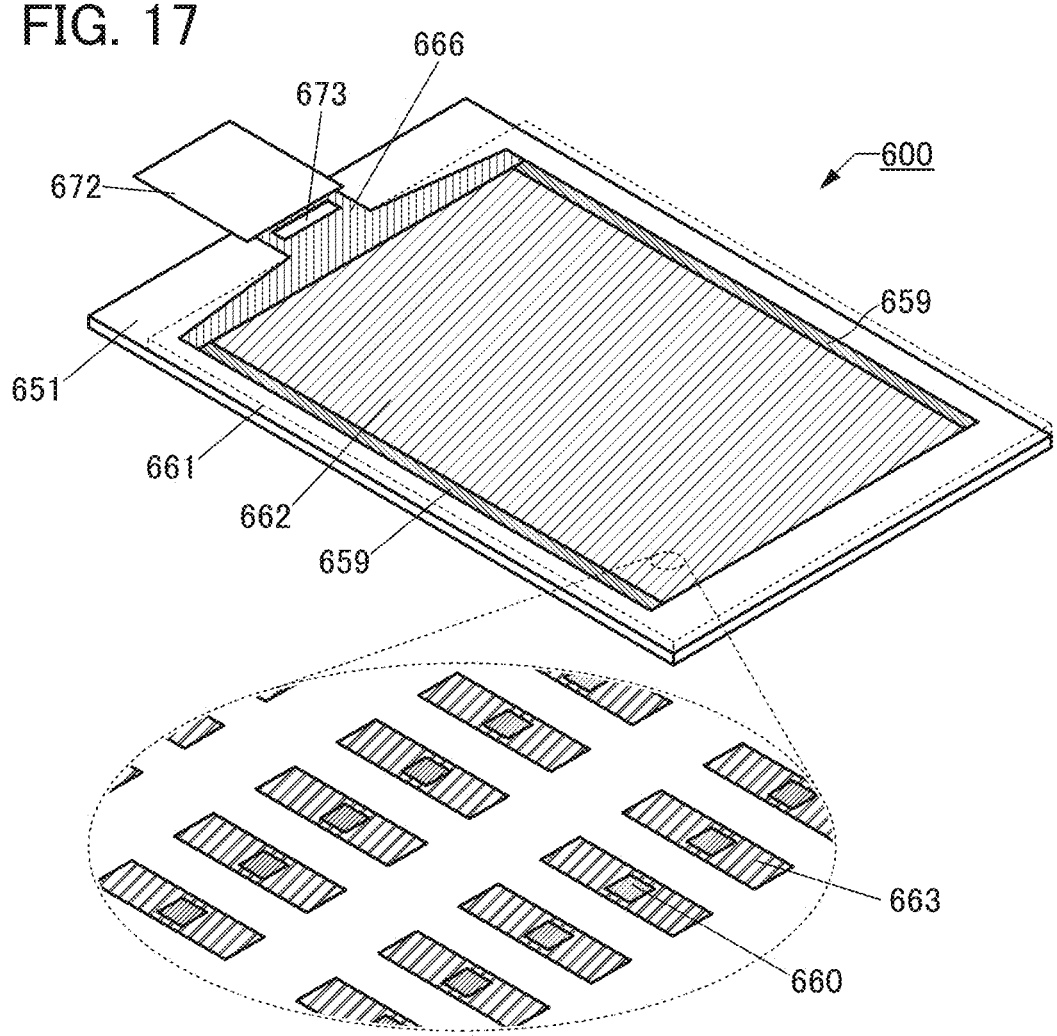
FIG. 17 is a schematic perspective view of a display device.

FIG. 17 is a schematic perspective view illustrating a display panel 600 of one embodiment of the present invention. In the display panel 600, a substrate 651 and a substrate 661 are attached to each other. In FIG. 17, the substrate 661 is denoted by a dashed line.

The display panel 600 includes a display portion 662, a circuit 659, a wiring 666, and the like. The substrate 651 is provided with the circuit 659, the wiring 666, a conductive film 663 which serves as a pixel electrode, and the like. In FIG. 17, an IC 673 and an FPC 672 are mounted on the substrate 651. Thus, the structure illustrated in FIG. 17 can be referred to as a display module including the display panel 600, the FPC 672, and the IC 673.

As the circuit 659, for example, a circuit functioning as a scan line driver circuit can be used.

The wiring 666 has a function of supplying a signal or electric power to the display portion or the circuit 659. The signal or electric power is input to the wiring 666 from the outside through the FPC 672 or from the IC 673.

FIG. 17 illustrates an example in which the IC 673 is provided on the substrate 651 by a chip on glass (COG) method or the like. As the IC 673, an IC functioning as a scan line driver circuit, a signal line driver circuit, or the like can be used. Note that it is possible that the IC 673 is not provided when, for example, the display panel 600 includes circuits functioning as a scan line driver circuit and a signal line driver circuit and when the circuits functioning as a scan line driver circuit and a signal line driver circuit are provided outside and a signal for driving the display panel 600 is input through the FPC 672. Alternatively, the IC 673 may be mounted on the FPC 672 by a chip on film (COF) method or the like.

FIG. 17 also illustrates an enlarged view of part of the display portion 662. The conductive films 663 included in a plurality of display elements are arranged in a matrix in the display portion 662. The conductive film 663 has a function of reflecting visible light and serves as a reflective electrode of a liquid crystal element 640 described later.

As illustrated in FIG. 17, the conductive film 663 has an opening. A light-emitting element 660 is positioned closer to the substrate 651 than the conductive film 663 is. Light is emitted from the light-emitting element 660 to the substrate 661 side through the opening in the conductive film 663.

<Cross-Sectional Structure Example>

Figure 18:
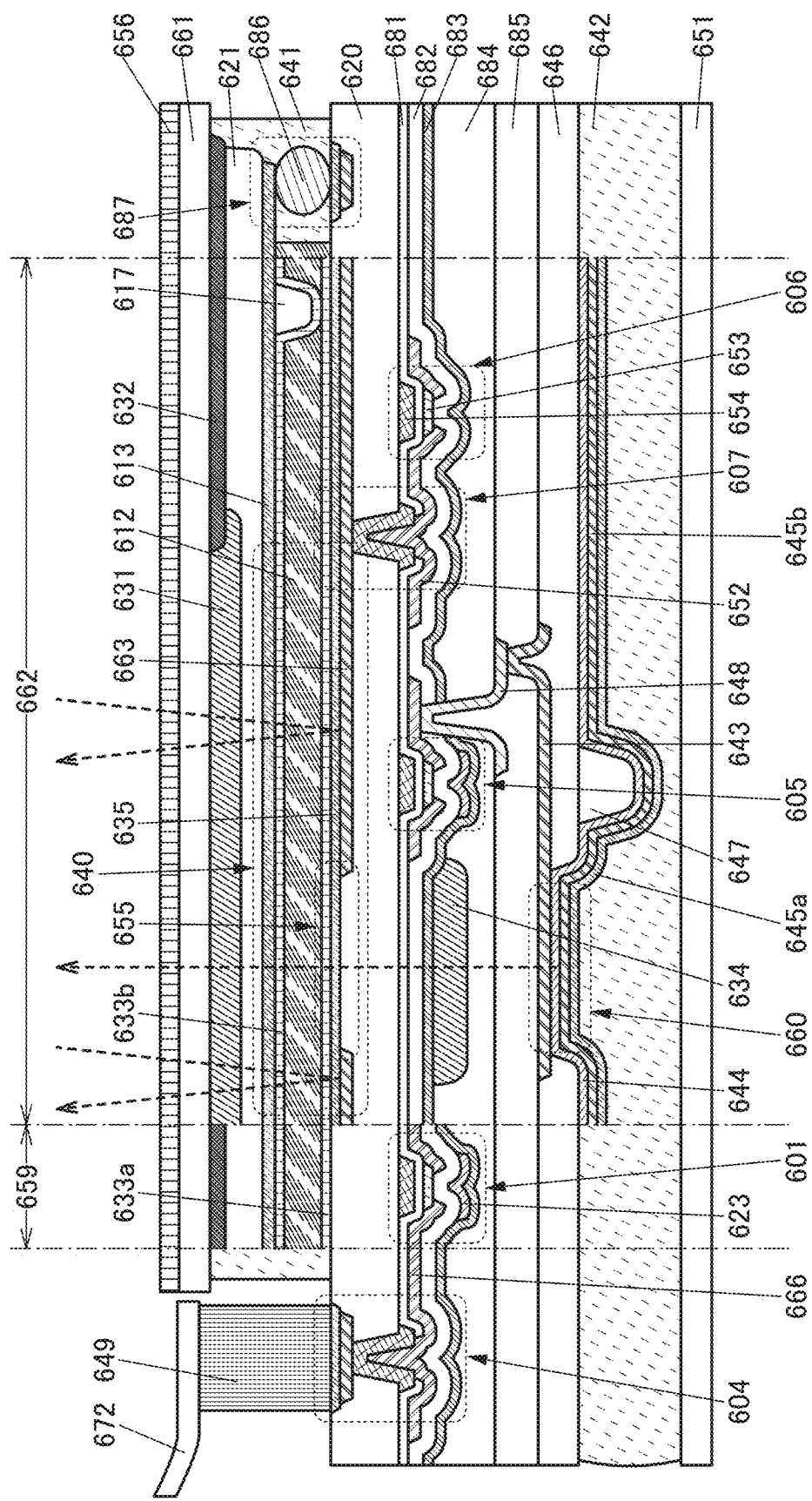
FIG. 18 is a cross-sectional view of a display device.

FIG. 18 illustrates an example of cross sections of part of a region including the FPC 672, part of a region including the circuit 659, and part of a region including the display portion 662 of the display panel illustrated in FIG. 17.

The display panel includes an insulating film 620 between the substrates 651 and 661. The display panel also includes the light-emitting element 660, a transistor 601, a transistor 605, a transistor 606, a coloring layer 634, and the like between the substrate 651 and the insulating film 620. Furthermore, the display panel includes the liquid crystal element 640, a coloring layer 631, and the like between the insulating film 620 and the substrate 661. The substrate 661 and the insulating film 620 are bonded with an adhesive layer 641. The substrate 651 and the insulating film 620 are bonded with an adhesive layer 642.

The transistor 606 is electrically connected to the liquid crystal element 640 and the transistor 605 is electrically connected to the light-emitting element 660. Since the transistors 605 and 606 are formed on a surface of the insulating film 620 which is on the substrate 651 side, the transistors 605 and 606 can be formed through the same process.

The substrate 661 is provided with the coloring layer 631, a light-blocking film 632, an insulating film 621, a conductive film 613 serving as a common electrode of the liquid crystal element 640, an alignment film 633*b*, an insulating film 617, and the like. The insulating film 617 serves as a spacer for holding a cell gap of the liquid crystal element 640.

Insulating layers such as an insulating film 681, an insulating film 682, an insulating film 683, an insulating film 684, and an insulating film 685 are provided on the substrate 651 side of the insulating film 620. Part of the insulating film 681 functions as a gate insulating layer of each transistor. The insulating films 682, 683, and 684 are provided to cover each transistor. The insulating film 685 is provided to cover the insulating film 684. The insulating films 684 and 685 each function as a planarization layer. Note that an example where the three insulating layers, the insulating films 682, 683, and 684, are provided to cover the transistors and the like is described here; however, one embodiment of the present invention is not limited to this example, and four or more insulating layers, a single insulating layer, or two insulating layers may be provided. The insulating film 684 functioning as a planarization layer is not necessarily provided.

The transistors 601, 605, and 606 each include a conductive film 654 part of which functions as a gate, a conductive film 652 part of which functions as a source or a drain, and a semiconductor film 653. Here, a plurality of layers obtained by processing the same conductive film are shown with the same hatching pattern.

The liquid crystal element 640 is a reflective liquid crystal element. The liquid crystal element 640 has a stacked structure of a conductive film 635, a liquid crystal layer 612, and the conductive film 613. In addition, the conductive film 663 which reflects visible light is provided in contact with the surface of the conductive film 635 that faces the substrate 651. The conductive film 663 includes an opening 655. The conductive films 635 and 613 contain a material transmitting visible light. In addition, an alignment film 633*a* is provided between the liquid crystal layer 612 and the conductive film 635 and the alignment film 633*b* is provided between the liquid crystal layer 612 and the conductive film 613. A polarizing plate 656 is provided on an outer surface of the substrate 661.

In the liquid crystal element 640, the conductive film 663 has a function of reflecting visible light and the conductive film 613 has a function of transmitting visible light. Light entering from the substrate 661 side is polarized by the polarizing plate 656, passes through the conductive film 613 and the liquid crystal layer 612, and is reflected by the conductive film 663. Then, the light passes through the liquid crystal layer 612 and the conductive film 613 again and reaches the polarizing plate 656. In this case, alignment of the liquid crystal is controlled with a voltage that is applied between the conductive film 613 and the conductive film 663, and thus optical modulation of light can be controlled. That is, the intensity of light emitted through the polarizing plate 656 can be controlled. Light other than that in a particular wavelength region is absorbed by the coloring layer 631, and thus, emitted light is red light, for example.

The light-emitting element 660 is a bottom-emission light-emitting element. The light-emitting element 660 has a structure in which a conductive film 643, an EL layer 644, and a conductive film 645*b* are stacked in this order from the insulating film 620 side. In addition, a conductive film 645*a* is provided to cover the conductive film 645*b*. The conductive film 645*b* contains a material reflecting visible light, and the conductive films 643 and 645*a* contain a material transmitting visible light. Light is emitted from the light-emitting element 660 to the substrate 661 side through the coloring layer 634, the insulating film 620, the opening 655, the conductive film 613, and the like.

Here, as illustrated in FIG. 18, the conductive film 635 transmitting visible light is preferably provided for the opening 655. Accordingly, the liquid crystal is aligned in a region overlapping with the opening 655 as well as in the other regions, in which case an alignment defect of the liquid crystal is prevented from being generated in the boundary portion of these regions and undesired light leakage can be suppressed.

As the polarizing plate 656 provided on an outer surface of the substrate 661, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 640 are controlled depending on the kind of the polarizing plate so that desirable contrast is obtained.

In addition, an insulating film 647 is provided on the insulating film 646 covering an end portion of the conductive film 643. The insulating film 647 has a function as a spacer for preventing the insulating film 620 and the substrate 651 from getting closer more than necessary. In the case where the EL layer 644 or the conductive film 645*a* is formed using a blocking mask (metal mask), the insulating film 647 may have a function of preventing the blocking mask from being in contact with a surface on which the EL layer 644 or the conductive film 645*a* is formed. Note that the insulating film 647 is not necessarily provided.

One of a source and a drain of the transistor 605 is electrically connected to the conductive film 643 of the light-emitting element 660 through a conductive film 648.

One of a source and a drain of the transistor 606 is electrically connected to the conductive film 663 through a connection portion 607. The conductive films 663 and 635 are in contact with and electrically connected to each other. Here, in the connection portion 607, the conductive layers provided on both surfaces of the insulating film 620 are connected to each other through an opening in the insulating film 620.

A connection portion 604 is provided in a region where the substrates 651 and 661 do not overlap with each other. The connection portion 604 is electrically connected to the FPC 672 through a connection layer 649. The connection portion 604 has a structure similar to that of the connection portion 607. On the top surface of the connection portion 604, a conductive layer obtained by processing the same conductive film as the conductive film 635 is exposed. Thus, the connection portion 604 and the FPC 672 can be electrically connected to each other through the connection layer 649.

A connection portion 687 is provided in part of a region where the adhesive layer 641 is provided. In the connection portion 687, the conductive layer obtained by processing the same conductive film as the conductive film 635 is electrically connected to part of the conductive film 613 with a connector 686. Accordingly, a signal or a potential input from the FPC 672 connected to the substrate 651 side can be supplied to the conductive film 613 formed on the substrate 661 side through the connection portion 687.

As the connector 686, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 686, a material capable of elastic deformation or plastic deformation is preferably used. As illustrated in FIG. 18, the connector 686 which is the conductive particle has a shape that is vertically crushed in some cases. With the crushed shape, the contact area between the connector 686 and a conductive layer electrically connected to the connector 686 can be increased, thereby reducing contact resistance and suppressing the generation of problems such as disconnection.

The connector 686 is preferably provided so as to be covered with the adhesive layer 641. For example, the connectors 686 are dispersed in the adhesive layer 641 before curing of the adhesive layer 641.

FIG. 18 illustrates an example of the circuit 659 in which the transistor 601 is provided.

The structure in which the semiconductor film 653 where a channel is formed is provided between two gates is used as an example of the transistors 601 and 605 in FIG. 18. One gate is formed using the conductive film 654 and the other gate is formed using a conductive film 623 overlapping with the semiconductor film 653 with the insulating film 682 provided therebetween. Such a structure enables control of threshold voltages of transistors. In this case, the two gates may be connected to each other and supplied with the same signal to operate the transistors. Such transistors can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display panel in which the number of wirings is increased because of increase in size or definition.

Note that the transistor included in the circuit 659 and the transistor included in the display portion 662 may have the same structure. A plurality of transistors included in the circuit 659 may have the same structure or different structures. A plurality of transistors included in the display portion 662 may have the same structure or different structures.

A material through which impurities such as water and hydrogen do not easily diffuse is preferably used for at least one of the insulating films 682 and 683 which cover the transistors. That is, the insulating film 682 or the insulating film 683 can function as a barrier film. Such a structure can effectively suppress diffusion of the impurities into the transistors from the outside, and a highly reliable display panel can be provided.

The insulating film 621 is provided on the substrate 661 side to cover the coloring layer 631 and the light-blocking film 632. The insulating film 621 may have a function as a planarization layer. The insulating film 621 enables the conductive film 613 to have an almost flat surface, resulting in a uniform alignment state of the liquid crystal layer 612.

A manufacturing method example of the display panel 600 is described. For example, the conductive film 635, the conductive film 663, and the insulating film 620 are formed in order over a support substrate provided with a separation layer, and the transistor 605, the transistor 606, the light-emitting element 660, and the like are formed. Then, the substrate 651 and the support substrate are bonded with the adhesive layer 642. After that, separation is performed at the interface between the separation layer and each of the insulating film 620 and the conductive film 635, whereby the support substrate and the separation layer are removed. Separately, the coloring layer 631, the light-blocking film 632, the conductive film 613, and the like are formed over the substrate 661 in advance. Then, the liquid crystal is dropped onto the substrate 651 or 661 and the substrates 651 and 661 are bonded with the adhesive layer 641, whereby the display panel 600 can be manufactured.

A material for the separation layer can be selected such that separation at the interface with the insulating film 620 and the conductive film 635 occurs. In particular, it is preferable that a stacked layer of a layer including a high-melting-point metal material, such as tungsten, and a layer including an oxide of the metal material be used as the separation layer, and a stacked layer of a plurality of layers, such as a silicon nitride layer, a silicon oxynitride layer, and a silicon nitride oxide layer be used as the insulating film 620 over the separation layer. The use of the high-melting-point metal material for the separation layer can increase the formation temperature of a layer formed in a later step, which reduces impurity concentration and achieves a highly reliable display panel.

As the conductive film 635, an oxide or a nitride such as a metal oxide, a metal nitride, or an oxide semiconductor whose resistance is reduced is preferably used. In the case of using an oxide semiconductor, a material in which at least one of the concentrations of hydrogen, boron, phosphorus, and other impurities and the number of oxygen vacancies is made to be higher than those in a semiconductor layer of a transistor is used for the conductive film 635.

<Components>

The above components are described below. Note that descriptions of structures having functions similar to those in the above embodiments are omitted.

[Adhesive Layer]

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Still alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, or zirconium can be used.

[Connection Layer]

As the connection layer, an anisotropic conductive film (ACF), an anisotropic conductive paste (ACP), or the like can be used.

[Coloring Layer]

Examples of a material that can be used for the coloring layer include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer that transmits light of a certain color and a film containing a material of a coloring layer that transmits light of another color can be employed. It is preferable that the coloring layer and the light-blocking layer be formed using the same material because the same manufacturing apparatus can be used and the process can be simplified.

The above is the description of the components.

<Manufacturing Method Example>

A manufacturing method example of a display panel using a flexible substrate is described.

Here, layers including a display element, a circuit, a wiring, an electrode, optical members such as a coloring layer and a light-blocking layer, an insulating layer, and the like, are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes an extremely thin film with a thickness greater than or equal to 10 nm and less than or equal to 300 μm and the like.

As a method for forming an element layer over a flexible substrate provided with an insulating surface, typically, there are two methods shown below. One of them is to directly form an element layer over the substrate. The other method is to form an element layer over a support substrate that is different from the substrate and then to separate the element layer from the support substrate to be transferred to the substrate. Although not described in detail here, in addition to the above two methods, there is a method in which the element layer is formed over a substrate which does not have flexibility and the substrate is thinned by polishing or the like to have flexibility.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to the support substrate, in which case transfer thereof in an apparatus and between apparatuses can be easy.

In the case of employing the method in which the element layer is formed over the support substrate and then transferred to the substrate, first, a separation layer and an insulating layer are stacked over the support substrate, and then the element layer is formed over the insulating layer. Next, the element layer is separated from the support substrate and then transferred to the substrate. At this time, a material is selected such that separation occurs at an interface between the support substrate and the separation layer, at an interface between the separation layer and the insulating layer, or in the separation layer. With the method, it is preferable that a material having high heat resistance be used for the support substrate or the separation layer, in which case the upper limit of the temperature applied when the element layer is formed can be increased, and an element layer including a more reliable element can be formed.

For example, it is preferable that a stacked layer of a layer containing a high-melting-point metal material, such as tungsten, and a layer containing an oxide of the metal material be used as the separation layer, and a stacked layer of a plurality of layers, such as a silicon oxide layer, a silicon nitride layer, a silicon oxynitride layer, and a silicon nitride oxide layer be used as the insulating layer over the separation layer.

The element layer and the support substrate can be separated by applying mechanical force, by etching the separation layer, or by injecting a liquid into the separation interface, for example. Alternatively, separation may be performed by heating or cooling two layers of the separation interface by utilizing a difference in thermal expansion coefficient.

The separation layer is not necessarily provided in the case where separation can occur at an interface between the support substrate and the insulating layer.

For example, glass and an organic resin such as polyimide can be used as the support substrate and the insulating layer, respectively. In this case, a separation trigger may be formed by, for example, locally heating part of the organic resin with laser light or the like, or by physically cutting part of or making a hole through the organic resin with a sharp tool, so that separation may be performed at an interface between the glass and the organic resin. As the above-described organic resin, a photosensitive material is preferably used because an opening or the like can be easily formed. The above-described laser light preferably has a wavelength region, for example, from visible light to ultraviolet light. For example, light having a wavelength of greater than or equal to 200 nm and less than or equal to 400 nm, preferably greater than or equal to 250 nm and less than or equal to 350 nm can be used. In particular, an excimer laser having a wavelength of 308 nm is preferably used because the productivity is increased. Alternatively, a solid-state UV laser (also referred to as a semiconductor UV laser), such as a UV laser having a wavelength of 355 nm which is the third harmonic of an Nd:YAG laser, may be used.

Alternatively, a heat-generation layer may be provided between the support substrate and the insulating layer formed of an organic resin, and separation may be performed at the interface between the heat-generation layer and the insulating layer by heating the heat-generation layer. The heat-generation layer can be formed using a variety of materials such as a material that generates heat when current flows therethrough, a material that generates heat when absorbs light, or a material that generates heat when applied with a magnetic field. For example, a semiconductor, a metal, or an insulator can be selected for the heat-generation layer.

In the aforementioned methods, the insulating layer formed of an organic resin can be used as a substrate after the separation.

The above is the description of a manufacturing method of a flexible display panel.

At least part of this embodiment can be implemented in combination with any of the other embodiments described in this specification as appropriate.

Embodiment 4

In this embodiment, applications of the semiconductor device described in any of the above embodiments are described. The semiconductor device described in any of the above embodiments is preferably used in an electronic device that can withstand high temperatures. The semiconductor device described in any of the above embodiments can be used, for example, for a protective circuit of a battery in an electronic device such as a computer display that can display images; and a protective circuit of a battery provided for an electromagnetic cooker or a vehicle (e.g., a bicycle) that is driven with power from a fixed power source.

Application examples of a semiconductor device that functions as a protective circuit are described with reference to FIGS. 19A to 19C.

Figure 19A:
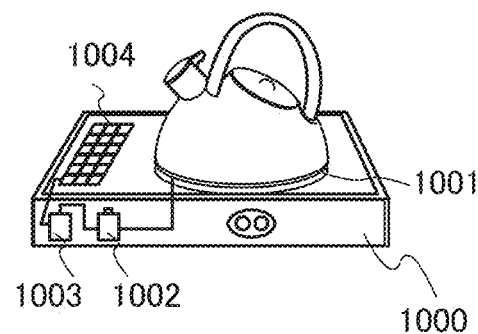
FIGS. 19A to 19C are schematic views each illustrating an electronic device.

FIG. 19A illustrates an electromagnetic cooker 1000 as an application example of a semiconductor device that functions as a protective circuit. The electromagnetic cooker 1000 heats cookware and the like by using electromagnetic induction generated by current flowing through a coil unit 1001. The electromagnetic cooker 1000 includes a battery 1002 for supplying current that is to flow through the coil unit 1001, a semiconductor device 1003 functioning as a protective circuit, and a solar battery 1004 for charging the battery 1002. Note that FIG. 19A illustrates the solar battery 1004 as a means to charge the battery 1002; alternatively, the battery 1002 may be charged by another means. The semiconductor device 1003 functioning as a protective circuit can reduce application of overvoltage to the battery 1002 even at high temperatures. Moreover, the off-state current that flows when the protective circuit is not operated is extremely low, and thus, the power consumption can be reduced.

Figure 19B:
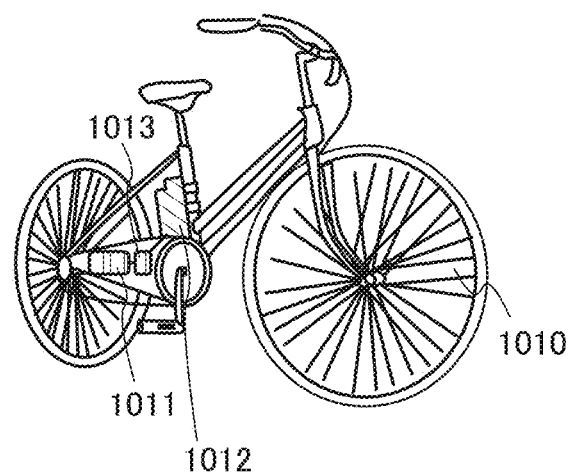

FIG. 19B illustrates an electric bicycle 1010 as an application example of a semiconductor device functioning as a protective circuit. The electric bicycle 1010 obtains power when current flows through a motor unit 1011. The electric bicycle 1010 includes a battery 1012 for supplying current that is to flow through the motor unit 1011 and a semiconductor device 1013 functioning as a protective circuit. Although a means to charge the battery 1012 is not particularly illustrated in FIG. 19B, the battery 1012 may be charged by an electric generator or the like that is additionally provided. The semiconductor device 1013 functioning as a protective circuit can reduce application of overvoltage to the battery 1012 even at high temperatures. Moreover, the off-state current that flows when the protective circuit is not operated is extremely low, and thus, the power consumption can be reduced. Note that although a pedal is illustrated in FIG. 19B, the pedal is not necessarily provided.

Figure 19C:
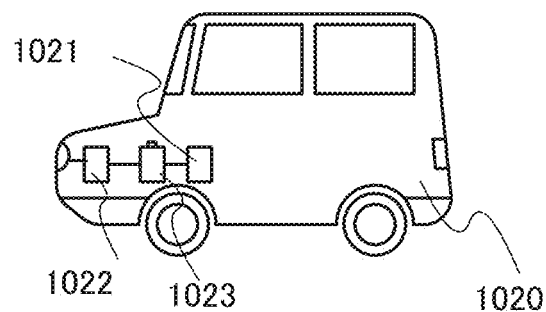

FIG. 19C illustrates an electric car 1020 as an application example of a semiconductor device functioning as a protective circuit. The electric car 1020 obtains power when current flows through a motor unit 1021. Moreover, the electric car 1020 includes a battery 1022 for supplying current that is to flow through the motor unit 1021 and a semiconductor device 1023 functioning as a protective circuit. Although a means to charge the battery 1022 is not particularly illustrated in FIG. 19C, the battery 1022 may be charged by an electric generator or the like that is additionally provided. The semiconductor device 1023 functioning as a protective circuit can reduce application of overvoltage to the battery 1022 even at high temperatures. Moreover, the off-state current that flows when the protective circuit is not operated is extremely low, and thus, the power consumption can be reduced.

Note that in this embodiment, what is illustrated in the drawing can be freely combined with or replaced with what is described in another embodiment as appropriate.

REFERENCE NUMERALS

001: first region, 002: second region, 002a: second region, 002b: second region, 10: sputtering target, 10a: sputtering target, 10b: sputtering target, 11: first region, 12: second region, 11a: first sputtered particle, 12a: second sputtered particle, 20: cation, 30: plasma, 41: deposition chamber, 50a: backing plate, 50b: backing plate, 52: target holder, 52a: target holder, 52b: target holder, 54a: magnet unit, 54b: magnet unit, 54N1: magnet, 54N2: magnet, 54S: magnet, 56: magnet holder, 58: member, 60: substrate, 62: substrate holder, 64a: magnetic line of force, 64b: magnetic line of force, 100: transistor, 102: substrate, 104: insulating film, 106: conductive film, 108: oxide semiconductor film, 108a: oxide semiconductor film, 108n: region, 110: insulating film, 110_0: insulating film, 112: conductive film, 112_0: conductive film, 112_1: conductive film, 112_2: conductive film, 116: insulating film, 118: insulating film, 120a: conductive film, 120b: conductive film, 122: insulating film, 140: mask, 141a: opening, 141b: opening, 143: opening, 150: transistor, 160: transistor, 300A: transistor, 300B: transistor, 300C: transistor, 300D: transistor, 302: substrate, 304: conductive film, 306: insulating film, 307: insulating film, 308: oxide semiconductor film, 312a: conductive film, 312b: conductive film, 314: insulating film, 316: insulating film, 318: insulating film, 320a: conductive film, 320b: conductive film, 341a: opening, 341b: opening, 342a: opening, 342b: opening, 342c: opening, 600: display panel, 601: transistor, 604: connection portion, 605: transistor, 606: transistor, 607: connection portion, 612: liquid crystal layer, 613: conductive film, 617: insulating film, 620: insulating film, 621: insulating film, 623: conductive film,

631: coloring layer, 632: light-blocking film, 633*a*: alignment film, 633*b*: alignment film, 634: coloring layer, 635: conductive film, 640: liquid crystal element, 641: adhesive layer, 642: adhesive layer, 643: conductive film, 644: EL layer, 645*a*: conductive film, 645*b*: conductive film, 646: insulating film, 647: insulating film, 648: conductive film, 649: connection layer, 651: substrate, 652: conductive film, 653: semiconductor film, 654: conductive film, 655: opening, 656: polarizing plate, 659: circuit, 660: light-emitting element, 661: substrate, 662: display portion, 663: conductive film, 666: wiring, 672: FPC, 673: IC, 681: insulating film, 682: insulating film, 683: insulating film, 684: insulating film, 685: insulating film, 686: connector, 687: connection portion, 1000: electromagnetic cooker, 1001: coil unit, 1002: battery, 1003: semiconductor device, 1004: solar battery, 1010: electric bicycle, 1011: motor unit, 1012: battery, 1013: semiconductor device, 1020: electric car, 1021: motor unit, 1022: battery, and 1023: semiconductor device.

This application is based on Japanese Patent Application Serial No. 2016-112153 filed with Japan Patent Office on Jun. 3, 2016 and Japanese Patent Application Serial No. 2016-113026 filed with Japan Patent Office on Jun. 6, 2016, the entire contents of which are hereby incorporated by reference.

The invention claimed is:

1. A sputtering target comprising:
a first region; and
a second region,
wherein the first region comprises an insulating material,
wherein the second region comprises a conductive material, and
wherein the first region and the second region each comprise a microcrystal whose diameter is greater than or equal to 0.5 nm and less than or equal to 3 nm, a value in a neighborhood of 0.5 nm, or a value in a neighborhood of 3 nm.

2. The sputtering target according to claim 1,
wherein the insulating material is $AlO_x$, and
wherein x is greater than 0 and less than 1.65.

3. The sputtering target according to claim 1,
wherein the insulating material is $AlO_xN_y$,
wherein x is greater than 0 and less than 1.65, and
wherein y is greater than 0 and less than 1.65.

4. The sputtering target according to claim 1,
wherein the insulating material is $SiO_x$, and
wherein x is greater than 0 and less than 2.2.

5. The sputtering target according to claim 1,
wherein the insulating material is $SiO_xN_y$,
wherein x is greater than 0 and less than 2.2, and
wherein y is greater than 0 and less than 2.2.

6. The sputtering target according to claim 1,
wherein the first region and the second region each comprise a microcrystal whose diameter is greater than or equal to 1 nm and less than or equal to 2 nm, a value in a neighborhood of 1 nm, or a value in a neighborhood of 2 nm.

7. An oxide semiconductor or an oxynitride semiconductor formed using the sputtering target according to claim 1.

8. A transistor comprising the oxide semiconductor or the oxynitride semiconductor according to claim 7.

9. The sputtering target according to claim 1,
wherein the insulating material is one or more of $AlO_x$, $AlN_y$, $AlO_xN_y$, $SiO_x$, $SiN_y$, and $SiO_xN_y$,
wherein the conductive material is one or more of $InO_x$, $InN_y$, $InO_xN_y$, $ZnO_x$, $ZnN_y$, and $ZnO_xN_y$,
wherein x is a given number greater than 0, and
wherein y is a given number greater than 0.

10. The sputtering target according to claim 9,
wherein an atomic ratio of In to Al and Zn in the sputtering target is 4:2:3, 5:1:6, a neighborhood of 4:2:3, or a neighborhood of 5:1:6.

11. The sputtering target according to claim 9,
wherein an atomic ratio of In to Si and Zn in the sputtering target is 4:2:3, 5:1:6, a neighborhood of 4:2:3, or a neighborhood of 5:1:6.

* * * * *